(12) United States Patent
Ohta et al.

(10) Patent No.: US 7,488,970 B2
(45) Date of Patent: Feb. 10, 2009

(54) SEMICONDUCTOR DEVICE

(75) Inventors: Hiroaki Ohta, Kyoto (JP); Toshio Nishida, Kyoto (JP); Daisuke Nakagawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 148 days.

(21) Appl. No.: 11/447,567

(22) Filed: Jun. 5, 2006

(65) Prior Publication Data

US 2006/0273329 A1    Dec. 7, 2006

(30) Foreign Application Priority Data

Jun. 7, 2005    (JP)    ............................... 2005-167482

(51) Int. Cl.
*H01L 29/06* (2006.01)
(52) U.S. Cl. ............................... 257/9; 257/12; 257/17; 257/79

(58) Field of Classification Search ................... 257/79, 257/9, 12–15, 17, 23, 94, 96, 97, 101, 102, 257/103; 438/22, 36, 37, 46, 47
See application file for complete search history.

(56) References Cited

U.S. PATENT DOCUMENTS 5,670,798 A * 9/1997 Schetzina .................... 257/96

FOREIGN PATENT DOCUMENTS

JP    11-177175    7/1999

* cited by examiner

*Primary Examiner*—Zandra V. Smith
*Assistant Examiner*—Paul E Patton
(74) *Attorney, Agent, or Firm*—Hogan & Hartson LLP

(57) ABSTRACT

The semiconductor device according to the present invention includes a semiconductor layer containing plural band gap change thin films in which a band gap is continuously monotonously changed in a laminating direction. Therefore, the present invention provides a semiconductor device having high reliability and low electric resistance.

4 Claims, 14 Drawing Sheets

SEMICONDUCTOR DEVICE

BACKGROUND OF THE INVENTION

The disclosure of Japanese Patent Application No. 2005-167482 filed Jun. 7, 2005 including specification, drawings and claims is incorporated herein by reference in its entirety.

FIELD OF THE INVENTION

The present invention relates to a semiconductor device formed by laminating plural semiconductor layers.

DESCRIPTION OF THE RELATED ART

Recently, a semiconductor superlattice structure which is formed by laminating different kinds of semiconductor thin films receives widespread attention. For example, when two kinds of semiconductor thin films having thicknesses similar to an electron wavelength of several nanometers are alternately laminated, band gaps of the two kinds of semiconductor thin films are alternately formed, and the band gaps are changed in a laminating direction. Accordingly, in the semiconductor superlattice structure, the narrow band gaps called quantum wells are arranged in the laminating direction at intervals similar to the electron wavelength. When electrons or holes are trapped in the plural quantum wells, the trapped electrons or holes exert wave properties to generate quantum effects such as a tunnel effect, diffraction or interference of a quantum wave. Therefore, because the semiconductor having the superlattice structure exerts physical properties and functions different from the bulk semiconductor, the semiconductor having the superlattice structure enables developments of a high-speed and low-power-composition device and a device having a radically new principle of operation. For example, a blue-violet laser diode is developed by utilizing a GaN nitride semiconductor (for example, see Japanese patent Application Laid-Open No. 11-177175).

FIG. 13 is a sectional view schematically showing a conventional semiconductor device 900. The semiconductor device 900 includes a superlattice layer 113 on a substrate 12. Semiconductor thin films 118 and semiconductor thin films 119 are alternately laminated in the superlattice layer 113, the semiconductor thin films 118 differ from the semiconductor thin films 119 in the band gap. In the following description, branched numbers are sequentially added to the semiconductor thin films 118 from the side of the substrate 12. When the semiconductor thin film 118 is written without adding the branched number, the description is given in common with all the semiconductor thin films 118 to which the branched numbers are added. The same holds true for the semiconductor thin film 119. Six sets of the semiconductor thin film 118 and the semiconductor thin film 119 are laminated in the superlattice layer 113 of FIG. 13. The band gap of the semiconductor thin film 119 is broader than that of the semiconductor thin film 118. FIG. 14 schematically shows a band diagram of the conventional semiconductor device 900. In FIG. 14, the numeral 21 designates a top level of a valence band and the numeral 22 designates a bottom level of a conduction band. The numeral 12a designates a band gap in a region of the substrate 12, the numeral 113a designates a band gap in a region of the superlattice layer 113, the numerals 118a-1 to 118a-6 designates band gaps in regions of semiconductor layers 118-1 to 118-6 respectively, and the numerals 119a-1 to 119a-6 designate band gaps in regions of semiconductor layers 119-1 to 119-6 respectively. In the superlattice layer 113, a portion where the band gap is steeply changed (hereinafter abbreviated to "band gap steep change portion") exists in each boundary between the semiconductor thin film 118 and the semiconductor thin film 119.

An impurity is frequently added to the superlattice layer in order to define polarity of the superlattice layer or in order to enhance carrier density to decrease electric resistance. However, when an impurity concentration is increased, because crystallinity of the superlattice layer is worsened, activation efficiency is decreased in the added impurity. Therefore, even if the amount of added impurity is simply increased, the carrier density of the superlattice layer never exceeds a predetermined value. When the impurity concentration is increased to a predetermined value or more, the impurity is diffused to other semiconductor layers adjacent to the semiconductor layer of the superlattice structure, which causes reliability to be decreased in the semiconductor device.

On the other hand, the semiconductor thin films constituting the superlattice layer frequently have different crystal structures. Therefore, in the band gap steep change portion, a polarization charge is generated by piezoelectric polarization caused by spontaneous polarization or lattice strain (hereinafter "piezoelectric polarization caused by spontaneous polarization or lattice strain" is abbreviated to "polarization"). The spontaneous polarization and the lattice strain are generated by a difference in polarization characteristics and a difference in lattice constant between the semiconductor thin films. In FIG. 14, the signs "+" and "−" written on the bottom level 22 of the conduction band schematically indicate the polarities of the polarization charges generated in the polarization. The sign "+" designates a positive polarization charge, and the sign "−" designates a negative polarization charge. The polarization charge can improve the activation efficiency of the added impurity, so that the active utilization of the polarization charge can control activation efficiency of the impurity to enhance the carrier density of the superlattice layer. However, when the polarization charge is increased, the polarization charge applies large Coulomb force to the carrier. Therefore, the electric resistance of the superlattice layer is increased because the polarization charge obstructs the carrier transport.

Accordingly, there is a problem that the maintenance of the semiconductor device reliability is hardly compatible with the smooth carrier transport.

The present invention is achieved to solve the above problem, an object of the invention is to provide a semiconductor device, in which the activation of the impurity is promoted to enhance the carrier density without increasing the impurity concentration and thereby the reliability is improved and the electric resistance is decreased.

SUMMARY OF THE INVENTION

In order to achieve the object, a semiconductor device according to the invention includes a semiconductor layer containing plural band gap change thin films whose band gaps are continuously monotonously changed in the laminating direction.

Specifically, a semiconductor device according to the invention is a semiconductor device including a semiconductor layer in which plural band gap change thin films are continuously laminated, a band gap being continuously monotonously changed in a laminating direction in the band gap change thin film, wherein directions in which the band gaps of at least the two adjacent band gap change thin films are monotonously changed are equal to each other in the semiconductor layer.

Because the band gap of the band gap change thin film is continuously monotonously changed in the laminating direction, the crystal structure in the band gap change thin film is also continuously monotonously changed in the laminating direction. Therefore, the polarization charges are widely dispersed in the band gap change thin film. The electric resistance can be decreased, because the polarization charge activates the impurity to enhance the carrier density of the band gap change thin film. The polarization charges are dispersed to decrease the Coulomb force which obstructs the carrier movement.

Therefore, the carrier can smoothly be moved in the laminating direction of the band gap change thin film, in the semiconductor layer where the plural band gap change thin film are laminated while directions in which the band gaps of the band gap changes thin film are changed (hereinafter abbreviated to "band gap change direction") are oriented toward the same direction.

Accordingly, the invention can provide the semiconductor device, in which the activation of the impurity is promoted to enhance the carrier density without increasing the impurity concentration and thereby the reliability is improved and the electric resistance is decreased.

In a semiconductor device according to the invention, preferably the semiconductor layer has a hetero-interface between at least the two band gap change thin films, the directions in which the band gaps are monotonously changed being equal to each other in at least the two adjacent band gap change thin films.

When the band gap change directions are oriented toward the same direction, in one band gap change thin film and the adjacent band gap change thin film, the sides are adjacent to each other while the compositions are different from each other. Therefore, a hetero-interface is generated to create the band gap steep change portion between the band gap change thin films. The band gap change directions are equal to each other at the hetero-interface, so that the polarities become similar to generate the same kind of polarization charge (hereinafter "the polarization charge generated at the hetero-interface" is abbreviated to "junction polarization charge"). Thus, the band gap change direction of the band gap change thin film is determined according to the kind and moving direction of the carrier moving through the semiconductor layer, which allows the carrier transport to be controlled in the semiconductor layer.

Accordingly, the invention can provide the semiconductor device, in which the activation of the impurity is promoted to enhance the carrier density without increasing the impurity concentration and thereby the reliability is improved and the electric resistance is decreased.

In order to achieve the object, a semiconductor device according to the invention is a semiconductor device including a semiconductor layer in which plural band gap change thin films are continuously laminated, a band gap being continuously monotonously changed in a laminating direction in the band gap change thin film, wherein directions in which the band gaps of at least the two adjacent band gap change thin films are monotonously changed are opposite to each other in the semiconductor layer.

In a semiconductor layer according to the invention, the band gap change thin films are laminated such that the direction in which the band gap is monotonously changed in one band gap change thin film being opposite to the direction in which the band gap is monotonously changed in the adjacent band gap change thin film. In the band gap change thin film, the carrier density is high, and the Coulomb force which obstructs the carrier transport is small. Therefore, in the semiconductor layer, the carrier can smoothly be moved in the laminating direction of the band gap change thin film.

Accordingly, the invention can provide the semiconductor device, in which the activation of the impurity is promoted to enhance the carrier density without increasing the impurity concentration and thereby the reliability is improved and the electric resistance is decreased.

In a semiconductor device according to the invention, a hetero-interface is not formed between at least the two band gap change thin films in the semiconductor layer, the directions in which the band gaps are monotonously changed being opposite to each other in at least the two adjacent band gap change thin films.

The band gap change thin films adjacent to each other are laminated such that the band gap change directions are opposite to each other, and the sides are adjacent to each other while the compositions are equal to each other in one band gap change thin film and the adjacent band gap change thin film. The hetero-interface is not generated between band gap change thin films, and the junction polarization charge is not generated. Therefore, the carriers can smoothly be moved between the band gap change thin films.

Accordingly, the invention can provide the semiconductor device, in which the activation of the impurity is promoted to enhance the carrier density without increasing the impurity concentration and thereby the reliability is improved and the electric resistance is decreased.

In a semiconductor device according to the invention, preferably the band gap change thin film is formed by a nitride semiconductor, the nitride semiconductor being made of a Group-III nitride compound expressed by a composition formula $Al_xGa_yIn_{1-x-y}N$ ($0 \leq x \leq 1$, $0 \leq y \leq 1$, $0 \leq x+y \leq 1$).

The Group-III nitride compound expressed by the composition formula $Al_xGa_yIn_{1-x-y}N$ ($0 \leq x \leq 1$, $0 \leq y \leq 1$, $0 \leq x+y \leq 1$) is a semiconductor in which the band gap can be adjusted by changing the composition. Therefore, the Group-III nitride compound is utilized for the band gap change thin film, because the band gap can monotonously changed by monotonously changing the composition specified by x and y in the Group-III nitride compound.

Accordingly, the invention can provide the semiconductor device, in which the activation of the impurity is promoted to enhance the carrier density without increasing the impurity concentration and thereby the reliability is improved and the electric resistance is decreased.

In the nitride semiconductor made of the Group-III nitride compound, the band gap change thin film may contain Si as an n-type impurity.

In the nitride semiconductor made of the Group-III nitride compound, the band gap change thin film may contain Mg as a p-type impurity.

The nitride semiconductor made of the Group-III nitride compound becomes the n-type semiconductor by containing the impurity of Si, and the nitride semiconductor becomes the p-type semiconductor by containing the impurity of Mg. Therefore, both the p-type semiconductor and the n-type semiconductor can be formed by the semiconductor layer in which the thin films made of the Group-III nitride compounds are laminated.

Accordingly, the invention can provide the semiconductor device, in which the activation of the impurity is promoted to enhance the carrier density without increasing the impurity concentration and thereby the reliability is improved and the electric resistance is decreased.

A semiconductor device according to the invention further includes a negative electrode which supplies an electron from an outside; a positive electrode which supplies a hole from the outside; and an active layer which emits light by recombination of the electron supplied from the negative electrode and the hole supplied from the positive electrode, wherein the semiconductor layer is arranged between the active layer and the positive electrode such that a laminating direction of the band gap change thin film is parallel to a laminating direction of the active layer in a hole moving path from the positive electrode to the active layer, and/or the semiconductor layer is arranged between the active layer and the negative electrode such that the laminating direction of the band gap change thin film is parallel to the laminating direction of the active layer in an electron moving path from the negative electrode to the active layer.

The semiconductor layer has the low electric resistance, so that the hole can smoothly be moved from the positive electrode to the active layer by arranging the semiconductor layer between the active layer and the positive electrode. On the other hand, the electron can smoothly be moved from the negative electrode to the active layer by arranging the semiconductor layer between the active layer and the negative electrode.

Accordingly, the invention can provide the semiconductor device, in which the activation of the impurity is promoted to enhance the carrier density without increasing the impurity concentration and thereby the reliability is improved and the electric resistance is decreased.

Thus, according to the invention, the activation of the impurity is promoted to enhance the carrier density without increasing the impurity concentration, and thereby the semiconductor device having high reliability and the low electric resistance can be provided.

DESCRIPTION OF THE PREFERRED EMBODIMENTS

Preferred embodiments of the invention will be described in detail with reference to the drawings. However, the invention is not limited to the following embodiments.

First Embodiment

A first embodiment of the invention is a semiconductor device including a semiconductor layer in which plural band gap change thin films are continuously laminated, a band gap being continuously monotonously changed in a laminating direction in the band gap change thin film, wherein directions in which the band gaps of at least the two adjacent band gap change thin films are monotonously changed are equal to each other in the semiconductor layer.

Figure 1:
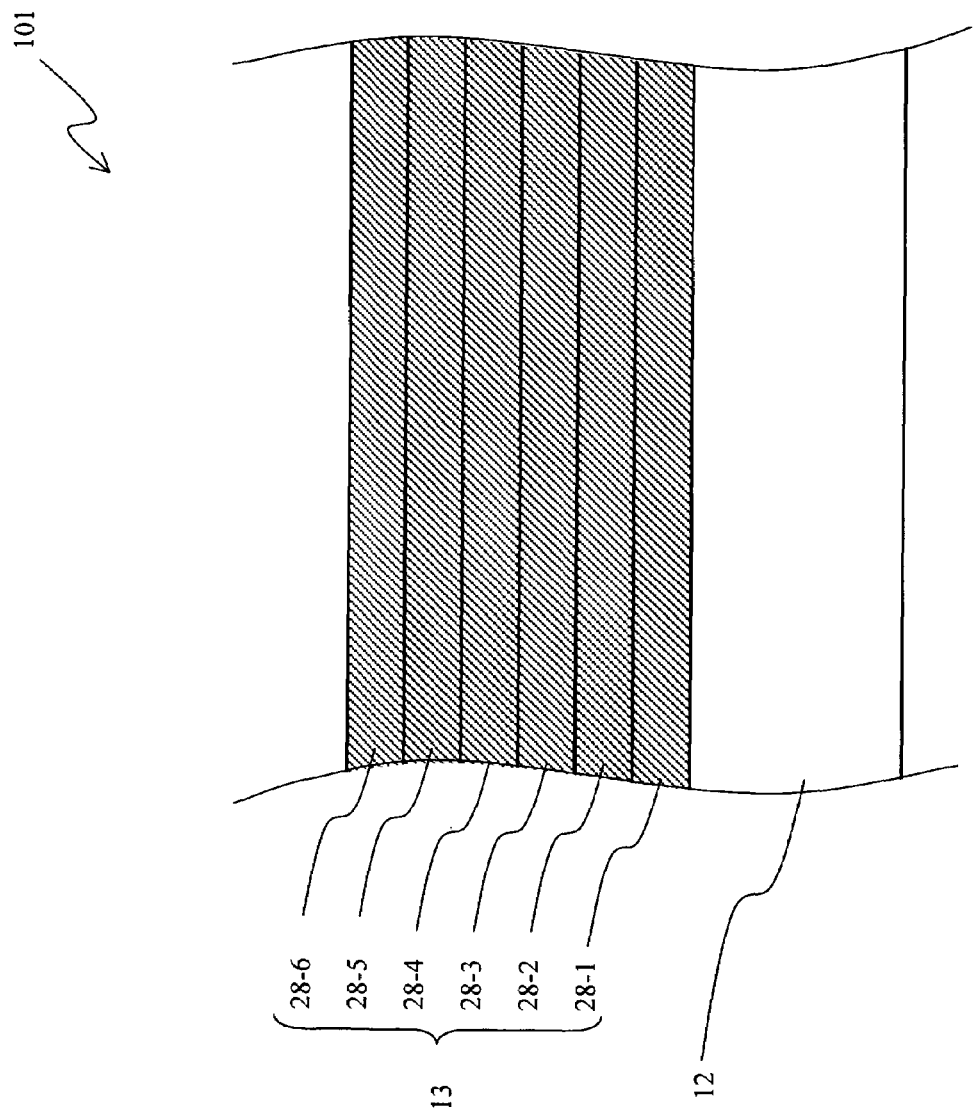
FIG. 1 is a sectional view schematically showing a semiconductor device 101 according to a first embodiment of the invention.

FIG. 1 is a sectional view schematically showing a semiconductor device 101 according to the first embodiment of the invention. The semiconductor device 101 sequentially includes a substrate 12 and a first semiconductor layer 13. The first semiconductor layer 13 includes plural band gap change thin films 28 in the laminating direction.

Referring to FIG. 1, branched numbers are sequentially added to the band gap change thin films 28 from the side of the substrate 12. In the following description, when the band gap change thin film 28 is written without adding the branched number, the description is given in common with all the band gap change thin films 28 to which the branched numbers are added.

The substrate 12 is arranged to physically support the semiconductor device 101 formed in the semiconductor thin film. A material in which the semiconductor thin film such as first semiconductor layer 13 is grown well is selected as the substrate for the semiconductor device 101. For example, in the case where a Group-III nitride compound expressed by a composition formula $Al_xGa_yIn_{1-x-y}N$ ($0 \leq x \leq 1$, $0 \leq y \leq 1$, $0 \leq x+y \leq 1$) (hereinafter "Group-III nitride compound expressed by composition formula $Al_xGa_yIn_{1-x-y}N$ ($0 \leq x \leq 1$, $0 \leq y \leq 1$, $0 \leq x+y \leq 1$)" is abbreviated to "$Al_xGa_yIn_{1-x-y}N$ compound") is laminated, gallium nitride (GaN), silicon carbide (SiC), and sapphire ($Al_2O_3$) can be cited as an example of the substrate 12.

The band gap change thin film 28 is a semiconductor thin film in which the band gap is continuously monotonously changed in the laminating direction. The band gap change direction of the band gap change thin film 28 is a direction in which the band gap on the side of the substrate 12 (one side) of the band gap change thin film 28 becomes narrower than the band gap on the side opposite to the substrate 12 (the other side) of the band gap change thin film 28. Because a composition of the band gap change thin film 28 is continuously monotonously changed, the polarization charges are generated in a dispersed manner in the band gap change thin film 28 to increase the carrier density of the band gap change thin film 28. The Coulomb force caused by the dispersed polarization charges is small, so that the carriers can smoothly be moved in the laminating direction in the band gap change thin film 28.

A nitride semiconductor which is made of the Group-III nitride compound expressed by the composition formula $Al_xGa_yIn_{1-x-y}N$ ($0 \leq x \leq 1$, $0 \leq y \leq 1$, $0 \leq x+y \leq 1$) can be cited as an example of the band gap change thin film.

The $Al_xGa_yIn_{1-x-y}N$ compound is a semiconductor in which the band gap can be changed by changing the composition. Accordingly, the band gap of the band gap change thin film 28 can monotonously be changed in the laminating direction by continuously monotonously changing x and y of the composition formula of the band gap change thin film 28 in the laminating direction. For example, in the band gap change thin film 28, a GaN compound (x=0 and y=1 in the composition formula) can be formed on one side, and an $Al_{0.08}Ga_{0.92}N$ compound (x=0.08 and y=0.92 in the composition formula) can be formed on the other side. Further, from the one side toward the other side, the band gap change thin film 28 can be formed by the composition, in which the value of x in the composition formula is continuously monotonously change from 0 to 0.08 and the value of y is continuously monotonously change from 1 to 0.92 while a correlation of x+y=1 is maintained. Accordingly, the band gap of the band gap change thin film 28 is broadened from one side toward the other side. However, the band gap of the band gap change thin film 28 is not linearly changed from one side toward the other side, but a rate of change of the band gap is preferably small near one side and the other side while the rate of change of the band gap becomes the maximum near the center between one side and the other side.

A thickness of the band gap change thin film 28 ranges from 2 nm to 50 nm, preferably ranges from 2 nm to 10 nm.

Because polarity of the band gap change thin film 28 is set at the p type, a p-type impurity is preferably added. In the case where the band gap change thin film 28 is made of the $Al_xGa_yIn_{1-x-y}N$ compound, Mg can be cited as an example of the p-type impurity. For example, an impurity concentration ranges from $1 \times 10^{18}$ cm$^{-3}$ to $1 \times 10^{20}$ cm$^{-3}$.

The first semiconductor layer 13 of FIG. 1 is formed by continuously laminating the band gap change thin films 28-1, 28-2, 28-3, 28-4, 28-5, and 28-6 in the laminating direction.

The thickness of the first semiconductor layer 13 is changed by adjusting the number of band gap change thin films 28 according to an application of the semiconductor device 101. For example, the thickness of the first semiconductor layer 13 ranges from 100 nm to 2000 nm, preferably ranges from 200 nm to 500 nm.

The first semiconductor layer 13 may include a heterointerface between at least the two adjacent band gap change thin films whose band gaps are monotonously changed in the same direction.

Because the first semiconductor layer 13 is formed by laminating only the band gap change thin films 28, the heterointerface is formed between the adjacent band gap change thin films 28.

Each semiconductor layer of the semiconductor device 101 is laminated by utilizing a metal organic chemical vapor deposition method (hereinafter "metal organic chemical vapor deposition method" is abbreviated to "MOCVD method"). The MOCVD method is a method, in which a source gas is introduced to a reaction furnace (chamber) and the source gas is thermally decomposed and reacted on the substrate to epitaxially grow the thin film. The substrate is fixed to the inside of the chamber and the substrate is maintained at temperatures ranging from 600° C. to 1100° C. In the MOCVD method, the semiconductor layers having different compositions or thicknesses can easily be laminated by controlling production parameters such as a flow rate and concentration of the source gas, reaction temperature and time, and a kind of a diluent gas.

In the case where the band gap change thin film 28 is made of the $Al_xGa_yIn_{1-x-y}N$ compound, vapor in which bubbling is performed to the Group-III elements of $Ga(CH_3)_3$ (trimethylgallium, hereinafter abbreviated to "TMG"), $In(C_2H_5)_3$ (triethylindium, hereinafter abbreviated to "TMI"), and $Al(CH_3)_3$ (trimethylaluminium, hereinafter abbreviated to "TMA") with hydrogen or nitrogen which is of a carrier gas is used as the source gas. In the MOCVD method, an ammonia vapor is used because the nitride is formed. In the MOCVD method, for the impurity, $CP_2Mg$ (cyclopentadienyl magnesium) which is of a p-type dopant can be introduced into the chamber, or $SiH_4$ (silane) which is of an n-type dopant can be introduced into the chamber. In the MOCVD method, the desired $Al_xGa_yIn_{1-x-y}N$ compound can be grown with the production parameters such as the substrate temperature and the flow rate of the mixed gas having a predetermined mixed ratio in which $CP_2Mg$ or SiH4, TMG, TMI, TMA, and ammonia are mixed together. In the MOCVD method, the thickness of the $Al_xGa_yIn_{1-x-y}N$ compound can be controlled by a reaction time.

The semiconductor device 101 is specifically produced as follows. The substrate 12 is placed in the chamber, the atmosphere in the chamber is replaced with the carrier gas, and the temperature of the substrate 12 is raised in the range of 600° C. to 1100° C.

Then, the source gas is introduced into the chamber along with the hydrogen or nitrogen carrier gas.

When the mixed gas is introduced into the reaction furnace to heat the reaction furnace with the predetermined production parameters, the growth of the $Al_xGa_yIn_{1-x-y}N$ compound is started on the substrate 12 such that the $Al_xGa_yIn_{1-x-y}N$ compound has the composition on the side at which the band gap change thin film 28-1 is in contact with the substrate 12. In the growth of the band gap change thin film 28-1, the flow rates of the vapors of TMG, TMI, TMA, and ammonia are continuously monotonously changed according to the reaction time. The band gap change thin film 28-1 in which the composition is monotonously changed in the laminating direction can be obtained by growing the $Al_xGa_yIn_{1-x-y}N$ compound in the above-described manner. In the case where the band gap change thin film 28-1 is formed by the p-type semiconductor, $CP_2Mg$ is added to the mixed gas.

Then, the band gap change thin film 28-2 is similarly grown on an upper surface of the band gap change thin film 28-1 on the substrate 12. The band gap change thin film 28-3 to the band gap change thin film 28-6 are grown in the same way.

Thus, in the MOCVD method, the semiconductor device 101 can be produced by continuously laminating the plural band gap change thin films 28 on the substrate 12.

An MBE method may be adopted as the method of growing the Group-III nitride compound thin film on the substrate 12.

Figure 2:
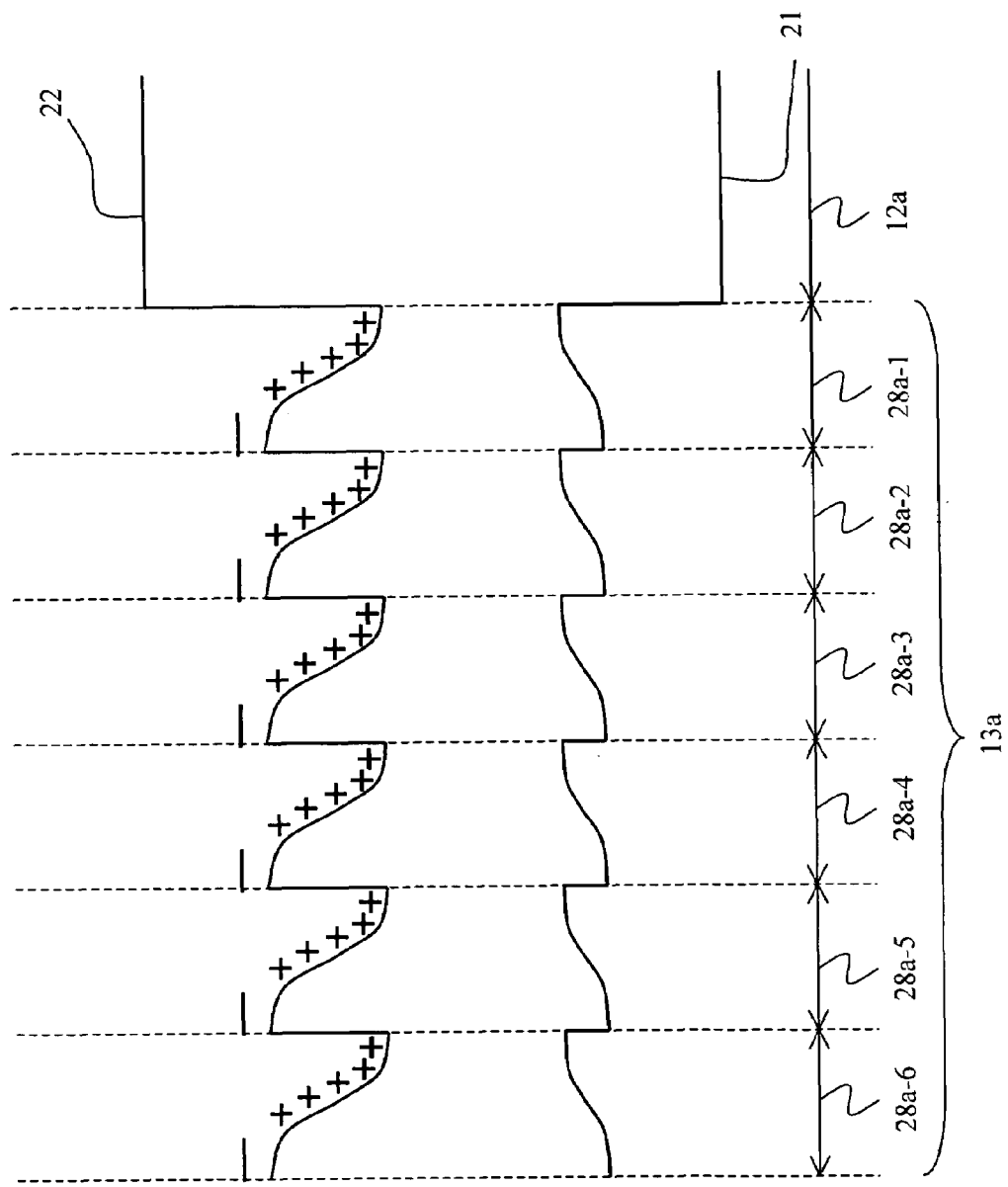
FIG. 2 schematically shows a band diagram of the semiconductor device 103 according to the first embodiment of the invention.

FIG. 2 schematically shows a band diagram of the semiconductor device 101 having the first semiconductor layer 13 in which the p-type band gap change thin films 28 are laminated. In FIG. 2, the numeral 21 designates a top level of a valence band and the numeral 22 designates a bottom level of the conduction band. The numeral 12a designates a band gap in a region of the substrate 12 and the numeral 13a designates a band gap in a region of the first semiconductor layer 13. The numerals 28a-1, 28a-2, 28a-3, 28a-4, 28a-5, and 28a-6 designate band gaps in regions of the band gap change thin films 28-1, 28-2, 28-3, 28-5, and 28-6 respectively. In the following drawings of the band diagram, the signs "+" and "−" denoted on the bottom level 22 of the conduction band schematically indicate the polarization charges generated in the semiconductor layer.

Figure 14:
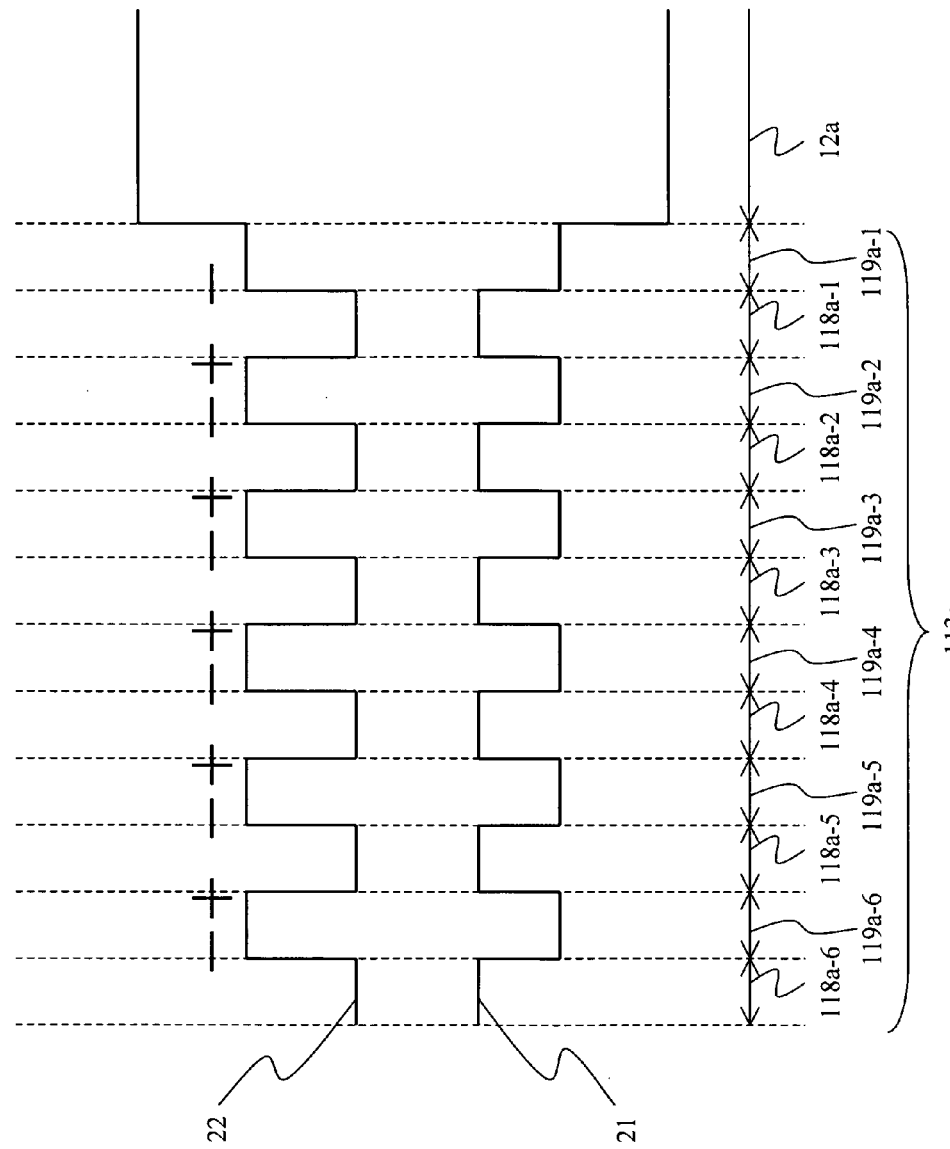
FIG. 14 schematically shows a band diagram of the conventional semiconductor device 900.

Because the band gap change thin film 28 is formed by the p-type semiconductor, the positive polarization charges are generated in the dispersed manner to activate the impurity in the band gap change thin film 28. On the other hand, the negative junction polarization charges are generated at the hetero-interface between the band gap change thin films 28. Because the value of the junction polarization charge is larger than the polarization charge in the band gap change thin film 28, the sign "−" is indicated larger in the band diagram of FIG. 2. In the first semiconductor layer 13, the positive polarization charges which exist periodically to obstruct the hole transport in the conventional superlattice layer shown in the band diagram of FIG. 14 are dispersed, and only the negative polarization charges which assist the hole transport exist periodically. Accordingly, the holes can smoothly be moved in the direction of the substrate 12 through the first semiconductor layer 13 in which the band gap change thin films 28 having the low electric resistances are laminated.

Thus, according to the invention, the activation of the impurity is promoted to enhance the carrier density without increasing the impurity concentration, and thereby the semiconductor device having high reliability and the low electric resistance can be provided.

Second Embodiment

Figure 3:
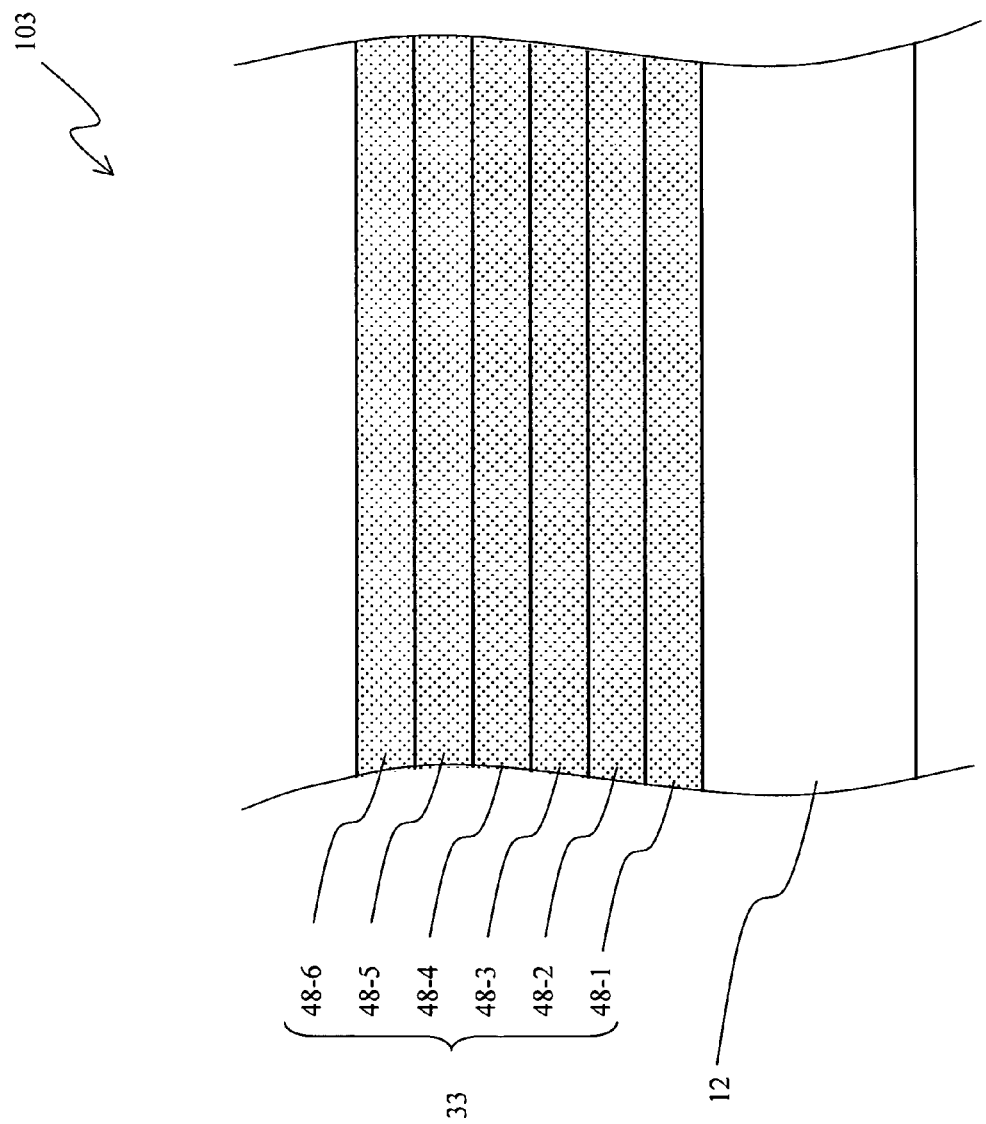
FIG. 3 is a sectional view schematically showing a semiconductor device 103 according to a second embodiment of the invention.

FIG. 3 is a sectional view schematically showing a semiconductor device 103 according to a second embodiment of the invention. The semiconductor device 103 sequentially includes the substrate 12 and a second semiconductor layer 33. In FIG. 3, the same layer or thin film as FIG. 1 is designated by the same numeral, and the same layer or thin film has the same function. The semiconductor device 103 differs from the semiconductor device 101 in that the semiconductor device 103 does not include the first semiconductor layer 13, but the semiconductor device 103 includes the second semiconductor layer 33. The second semiconductor layer 33 includes the plural band gap change thin films 48 in the laminating direction. When the band gap change thin film 48 without adding the branched number, the description is given in common with all the band gap change thin films 48.

Similarly to the band gap change thin film 28, the band gap change thin film 48 is a semiconductor thin film in which the band gap is continuously monotonously changed in the laminating direction. The band gap change thin film 48 differs from the band gap change thin film 28 in the band gap change direction. That is, the band gap change direction of the band gap change thin film 48 is a direction in which the band gap on the side of the substrate 12 (one side) of the band gap change thin film 48 becomes broader than the band gap on the side opposite to the substrate 12 (the other side) of the band gap change thin film 48.

Similarly to the band gap change thin film 28, the band gap change thin film 48 can be made of the $Al_xGa_yIn_{1-x-y}N$ compound. Similarly to the band gap change thin film 28, in the band gap change thin film 48, the rate of change of the band gap is preferably small near one side and the other side while the rate of change of the band gap becomes the maximum near the center between one side and the other side.

The band gap change thin film 48 preferably has the thickness illustrated by the band gap 28.

Because the polarity of the band gap change thin film 28 is set at the n type, the n-type impurity is preferably added. In the case where the band gap change thin film 48 is made of the $Al_xGa_yIn_{1-x-y}N$ compound, Si can be cited as an example of the n-type impurity. For example, the impurity concentration ranges from $1\times10^{17}$ cm$^{-3}$ to $1\times10^{19}$ cm$^{-3}$.

The second semiconductor layer 33 of FIG. 3 is formed by continuously laminating the band gap change thin films 48-1, 48-2, 48-3, 48-4, 48-5, and 48-6 in the laminating direction. Because the second semiconductor layer 33 is formed by laminating only the band gap change thin films 48, the hetero-interface is formed between the adjacent band gap change thin films 48.

The thickness of the second semiconductor layer 33 can be changed by adjusting the number of band gap change thin films 48 according to an application of the semiconductor device 103. For example, the thickness of the second semiconductor layer 33 ranges from 300 nm to 2000 nm, preferably ranges from 400 nm to 1200 nm.

The semiconductor device 103 is produced by the MOCVD method described in the semiconductor device 101 of FIG. 1.

Figure 4:
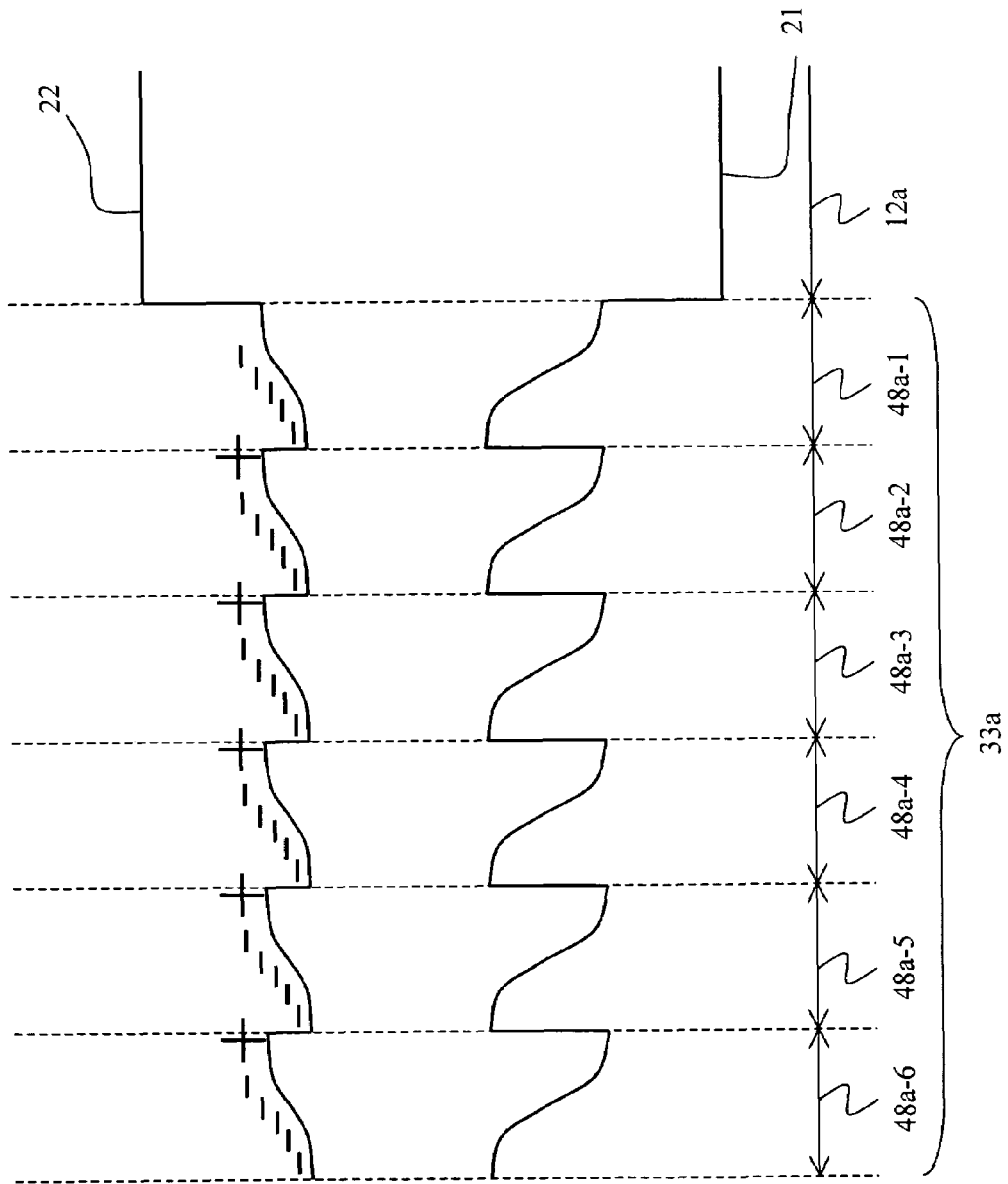
FIG. 4 schematically shows a band diagram of the semiconductor device 105 according to the second embodiment of the invention.

FIG. 4 schematically shows a band diagram of the semiconductor device 103 having the second semiconductor layer 33 in which the n-type band gap change thin films 48 are laminated. In FIG. 4, the numeral 21 designates the top level of the valence band and the numeral 22 designates the bottom level of the conduction band. The numeral 12a designates the band gap in the region of the substrate 12 and the numeral 33a designates a band gap in a region of the second semiconductor layer 33. The numerals 48a-1, 48a-2, 48a-3, 48a-4, 48a-5, and 48a-6 designate band gaps in regions of the band gap change thin film 48-1, 48-2, 48-3, 48-4, 48-5, and 48-6 respectively.

Because the band gap change thin film 48 is formed by the n-type semiconductor, the negative polarization charges are generated in the dispersed manner to activate the impurity in the band gap change thin film 48. On the other hand, the positive junction polarization charges are generated at the hetero-interface between the band gap change thin films 48. Because the value of the junction polarization charge is larger than the polarization charge in the band gap change thin film 48, the sign "+" is indicated larger in the band diagram of FIG. 4. In the second semiconductor layer 33, the negative polarization charges which exist periodically to obstruct the electron transport in the conventional superlattice layer shown in the band diagram of FIG. 4 are dispersed, and only the positive polarization charges which assist the electron transport exist periodically. Accordingly, the electrons can smoothly be moved in the direction of the substrate 12 through the second semiconductor layer 33 in which the band gap change thin films 48 having the low electric resistances are laminated.

Thus, according to the invention, the activation of the impurity is promoted to enhance the carrier density without increasing the impurity concentration, and thereby the semiconductor device having high reliability and the low electric resistance can be provided.

Third Embodiment

A third embodiment of the invention is a semiconductor device including a semiconductor layer in which plural band gap change thin films are continuously laminated, a band gap being continuously monotonously changed in a laminating direction in the band gap change thin film, wherein directions in which the band gaps of at least the two adjacent band gap change thin films are monotonously changed are opposite to each other in the semiconductor layer.

Figure 5:
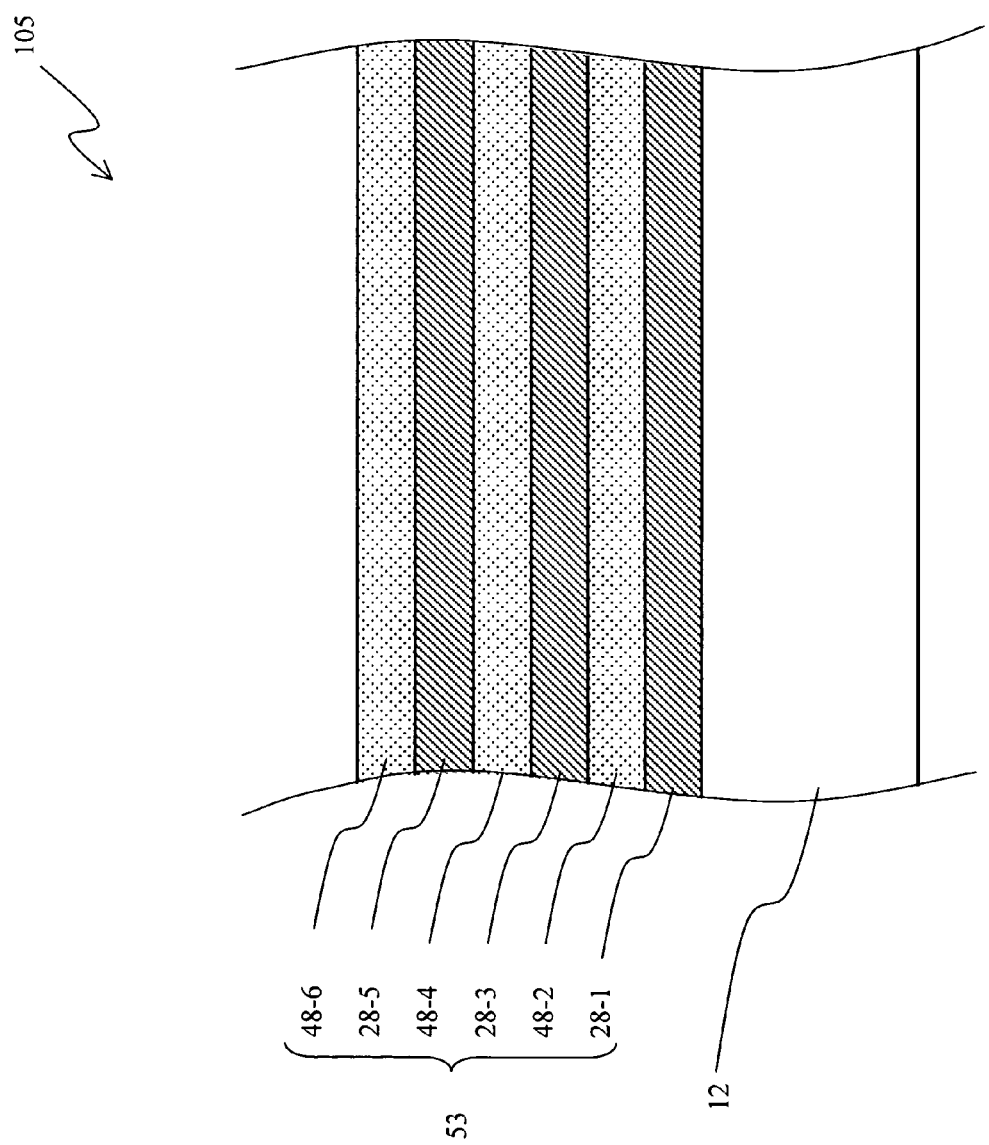
FIG. 5 is a sectional view schematically showing a semiconductor device 105 according to a third embodiment of the invention.

FIG. 5 is a sectional view schematically showing a semiconductor device 105 according to the third embodiment of the invention. The semiconductor device 105 sequentially includes the substrate 12 and a third semiconductor layer 53. In FIG. 5, the same layer or thin film as FIG. 1 is designated by the same numeral, and the same layer or thin film has the same function. The semiconductor device 105 differs from the semiconductor device 101 of FIG. 1 in that the semiconductor device 105 does not include the first semiconductor layer 13, but the semiconductor device 105 includes the third semiconductor layer 53.

In the third semiconductor layer 53, the band gap change thin film 28 and the band gap change thin film 48 are alternately laminated. Accordingly, the third semiconductor layer 53 has a low electric resistance.

In the third semiconductor layer 53, the hetero-interface is not formed between at least the two adjacent band gap change thin films in which monotonous change directions of the band gaps are opposite to each other.

The crystal structures are substantially equal to each other between the band gap change thin film 28 and the band gap change thin film 48, and the hetero-interface is not formed between the band gap change thin film 28 and the band gap change thin film 48. Therefore, the junction polarization charge is not generated between the band gap change thin film 28 and the band gap change thin film 48.

Similarly to the semiconductor device 101 of FIG. 1, the semiconductor device 105 is produced by continuously laminating the plural band gap change thin films 28 and band gap change thin films 48 on the upper surface of the substrate 12 using the MOCVD method.

Figure 6:
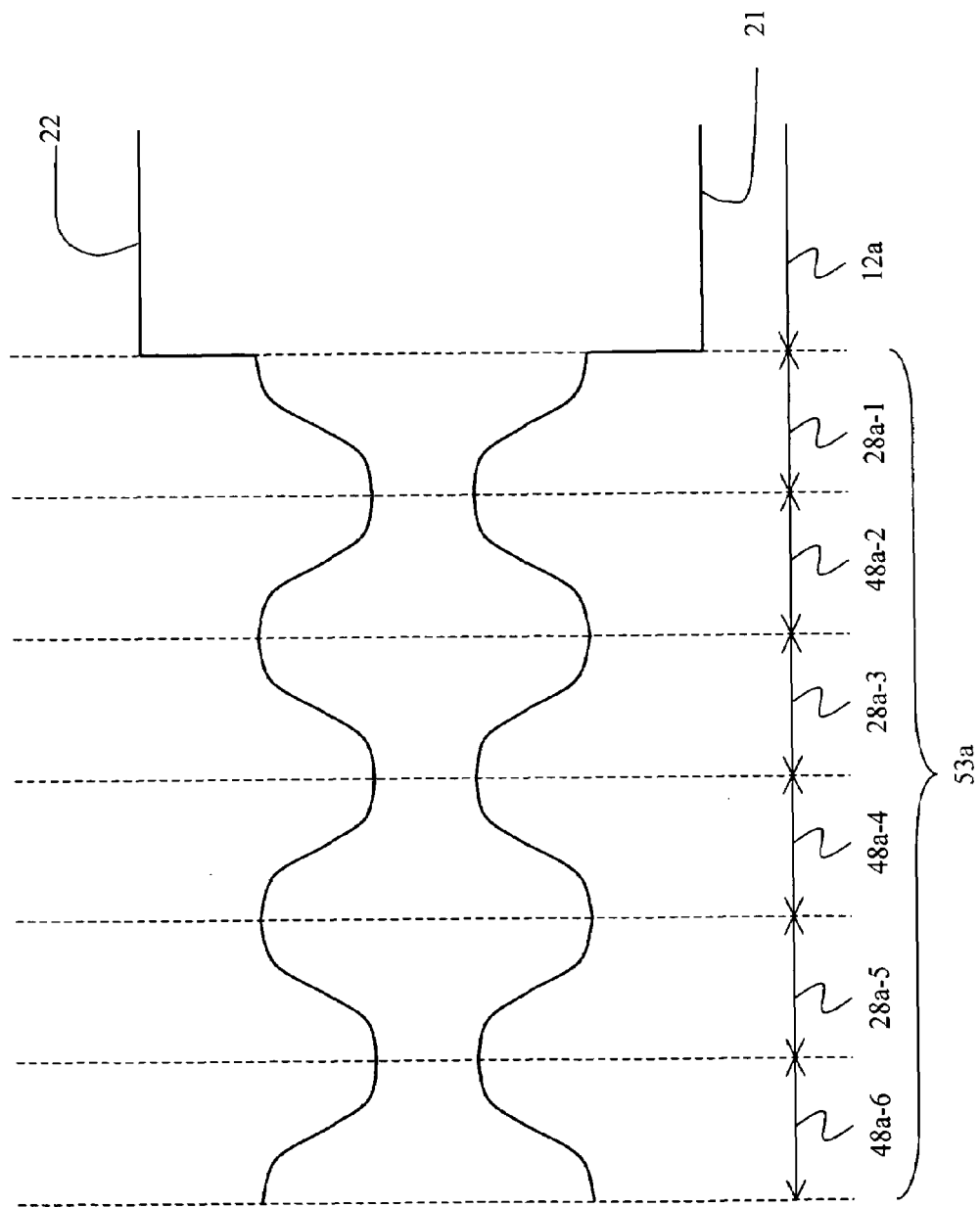
FIG. 6 schematically shows a band diagram of the semiconductor device 105 according to the third embodiment of the invention.

FIG. 6 schematically shows a band diagram of the semiconductor device 105. In FIG. 6, the numeral 21 designates the top level of the valence band and the numeral 22 designates the bottom level of the conduction band. The numeral 12*a* designates the band gap in the region of the substrate 12 and the numeral 53*a* designates a band gap in a region of the third semiconductor layer 53. The numerals 28*a*-1, 48*a*-2, 28*a*-3, 48*a*-4, 28*a*-5, and 48*a*-6 designate band gaps in regions of the band gap change thin film 28-1, 48-2, 28-3, 48-4, 28-5, and 48-6 respectively. The band gap is continuously changed from the band gap change thin film 28 to the band gap change thin film 48, and the band gap is also continuously changed from the band gap change thin film 48 to the band gap change thin film 28, which causes the band gap of the third semiconductor layer 53 to be continuously repeatedly increased and decreased in the laminating direction, and the band gap steep change portion is not generated. Therefore, because the Coulomb force does not apply the carriers in the third semiconductor layer 53, the carrier can smoothly be moved in the laminating directions of the band gap change thin film 28 and band gap change thin film 48.

Thus, according to the invention, the activation of the impurity is promoted to enhance the carrier density without increasing the impurity concentration, i.e., without decreasing the reliability, and thereby the semiconductor device having high reliability and the low electric resistance can be provided.

Fourth Embodiment

A fourth embodiment of the invention is a semiconductor device further including a negative electrode which supplies an electron from an outside; a positive electrode which supplies a hole from the outside; and an active layer which emits light by recombination of the electron supplied from the negative electrode and the hole supplied from the positive electrode, wherein the semiconductor layer is arranged between the active layer and the positive electrode such that a laminating direction of the band gap change thin film is parallel to a laminating direction of the active layer in a hole moving path from the positive electrode to the active layer, and/or the semiconductor layer is arranged between the active layer and the negative electrode such that the laminating direction of the band gap change thin film is parallel to the laminating direction of the active layer in an electron moving path from the negative electrode to the active layer.

Figure 7:
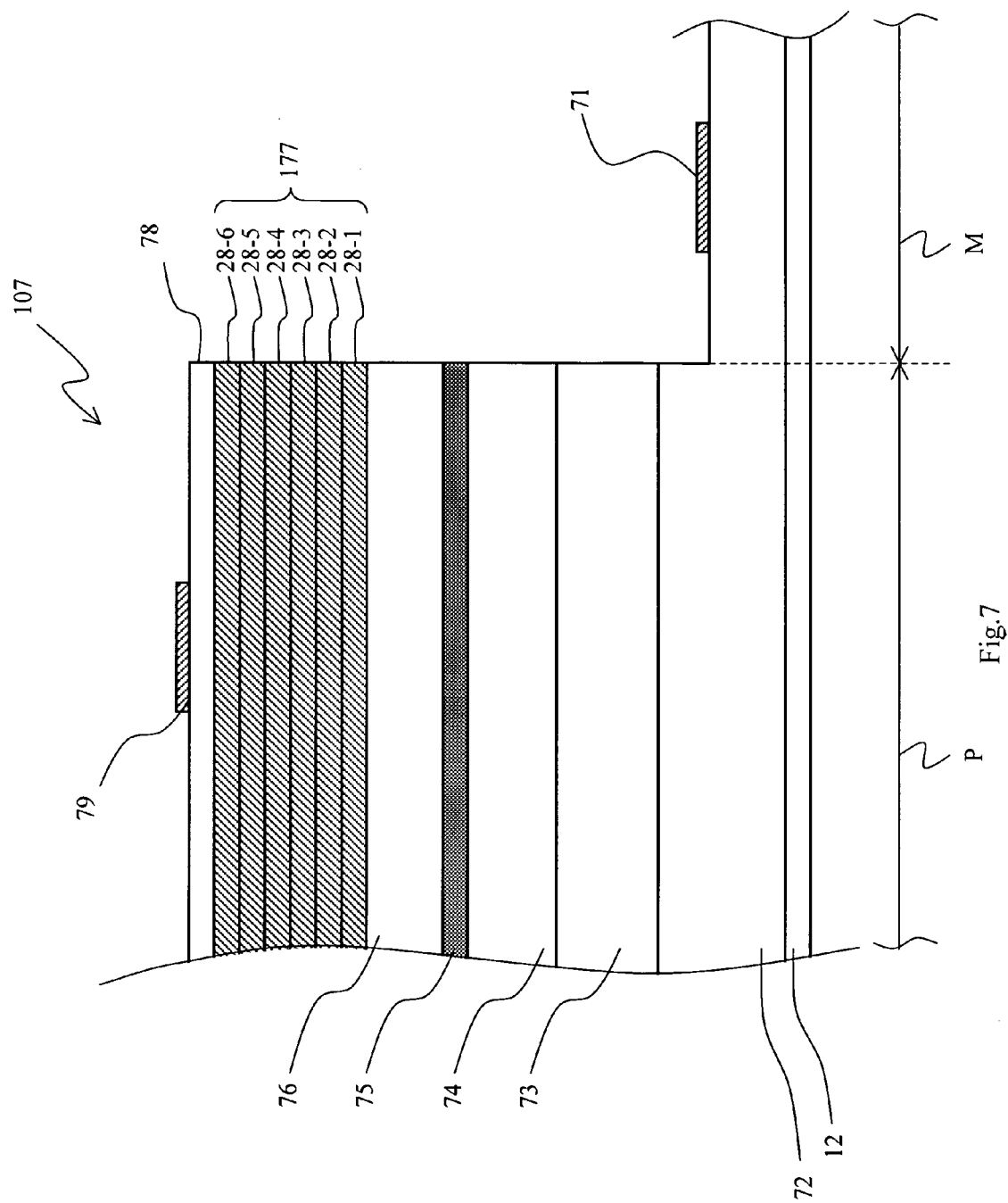
FIG. 7 is a sectional view schematically showing a semiconductor device 107 according to a fourth embodiment of the invention.

FIG. 7 is a sectional view schematically showing a semiconductor device 107 according to the fourth embodiment of the invention. The semiconductor device 107 includes an electrode 71, an n-type underlying layer 72, an n-type fifth semiconductor layer 73, an n-side sixth semiconductor layer 74, an active layer 75, a p-side seventh semiconductor layer 76, a p-type eighth semiconductor layer 177, a p-type contact layer 78, and a stripe-shape electrode 79. In the semiconductor device 107, the semiconductor layers are laminated on the substrate 12, and the semiconductor layers located on the side of the stripe-shape electrode 79 with respect to the active layer 75, i.e., at least the p-type eighth semiconductor layer 177 and the p-type contact layer 78 on the p-type side with respect to the active layer 75 are formed by the p-type semiconductor. On the other hand, the semiconductor layers located on the side of the substrate 12 with respect to the active layer 75, i.e., at least the n-type fifth semiconductor layer 73 and the n-type underlying layer 72 on the n-type side with respect to the active layer 75 are formed by the n-type semiconductor. The semiconductor device 107 is a semiconductor light emitting device in which the electrode 71 and the stripe-shape electrode 79 are arranged on the same side with respect to the substrate 12. In FIG. 7, the same layer or thin film as FIG. 1 is designated by the same numeral, and the same layer or thin film has the same function.

The electrode 71 and the stripe-shape electrode 79 are arranged to apply voltage to the semiconductor device 107. The electrode 71 functions as a negative electrode, and the stripe-shape electrode 79 functions as a positive electrode. The electrode 71 and the stripe-shape electrode 79 are desirably made of a material which can be in ohmic contact with the semiconductor, because efficiency is lost as the semiconductor device when a rectifying property is generated in bringing the electrode and the semiconductor into contact with each other. The electrode 71 and the stripe-shape electrode 79 are preferably made of a material having small contact resistance between an interconnection and an external device such as a power supply. Therefore, the electrode 71 and the stripe-shape electrode 79 may have a structure in which a material which becomes a buffer is sandwiched between a material on the side having contact with the semiconductor and a material having contact with the interconnection. Ti/Al/Ti/Au and Al/Au can be cited as an example of the material for the electrode 71 having contact with the n-type semiconductor. Ni/Au, Pd/Au, and Pt/Au can be cited as an example of the material for the stripe-shape electrode 79 having contact with the p-type semiconductor.

The stripe-shape electrode 79 is arranged on the p-type contact layer 78 to supply the carriers to a part of the active layer 75 in a concentrated manner.

The active layer 75 is a layer which emits light by recombination of the electron and the hole. The wavelength of the emitted light emitted is determined by the band gap of a material used for the active layer 75. The material used for the active layer 75 is preferably a direct transition type semiconductor having high light emission efficiency. Because the various band gaps can be formed by changing the composition in the $Al_xGa_yIn_{1-x-y}N$ compound thin film, the semiconductor light emitting device which emits the light having the desired wavelength can be produced when the $Al_xGa_yIn_{1-x-y}N$ compound thin film is used as the active layer 75. In the active layer 75, at least two kinds of semiconductor thin films having the different band gaps can also alternately be arranged to form a multiple quantum well (MQW) structure in which the semiconductor thin layer having the broader band gap is set at a barrier layer while the semiconductor thin layer having the narrower band gap is set at a well layer. When the active layer 75 is formed into the MQW structure, the electrons can be concentrated in a particular energy state to efficiently emit the light even in the small electric current. In the case of the MQW structure, the wavelength of the emitted light is determined by the band gap of the well layer. The both ends of MQW may be formed by the barrier layer, and both ends of the MQW structure may be formed by the well layer. For example, the Group-III nitride compound thin film in which x=0 and y=q ($0.95 \leq q \leq 1$, preferably $0.97 \leq q \leq 1$) in the composition formula, namely, the Group-III nitride compound thin film whose composition formula is expressed by $Ga_qIn_{1-q}N$ can be cited as an example of the barrier layer. On the other hand, the Group-III nitride compound thin film in which x=0 and y=p (p<q and $0.80 \leq p \leq 0.95$, preferably $0.85 \leq p \leq 0.9$) in the composition formula, namely, the Group-III nitride compound thin film whose composition formula is expressed by $Ga_pIn_{1-p}N$ can be cited as an example of the well layer. In the following description, "the Group-III nitride compound whose composition formula is expressed by GaN" is abbreviated to "GaN compound," and "the Group-III nitride compound whose composition formula is expressed by $Ga_pIn_{1-p}N$" is abbreviated to "$Ga_pIn_{1-p}N$ compound."

Preferably the thickness of the barrier layer ranges from 5 nm to 20 nm, and more preferably the thickness ranges from 7 nm to 15 nm.

Preferably the thickness of the well layer ranges from 1 nm to 10 nm, and more preferably the thickness ranges from 3 nm to 5 nm.

In the thicknesses of the active layer 75, the thickness of the MQW structure (the total of thicknesses of the barrier layer and the well layer) preferably ranges from 380 nm to 480 nm.

There is a phenomenon of carrier overflow, in which the electrons receiving thermal energy generated by the heat associated with the light emission of the semiconductor light emitting device overcome the barrier of the quantum well and are moved to the semiconductor layer on the p-type side. In order to prevent the carrier overflow, the electron barrier layer made of an $Al_xGa_yIn_{1-x-y}N$ compound may be arranged at the end of the MQW structure on the p-type side. Because the electron barrier layer has the wide band gap and the high bottom level of the conduction band, even if the electron which obtains the thermal energy, the electron cannot be moved to the semiconductor layer on the p-type side through the electron barrier layer. For example, the Group-III nitride compound thin film in which x=s and x+y=1 ($0.1 \leq s \leq 0.3$, preferably $0.15 \leq s \leq 0.25$) in the composition formula, namely, the Group-III nitride compound thin film whose composition formula is expressed by $Al_sGa_{1-s}N$ (hereinafter "Group-III nitride compound thin film whose composition formula is expressed by $Al_sGa_{1-s}N$" is abbreviated to "$Al_sGa_{1-s}N$ compound") can be cited as an example of the electron barrier layer. For example, the thickness of the electron barrier layer ranges from 10 nm to 30 nm, and preferably the thickness ranges from 15 nm to 25 nm. In the p-type semiconductor layer, the carrier overflow electron becomes the ineffective carrier which is not engaged in the light emission, and the carrier overflow electron decreases luminous efficiency of the semiconductor light emitting device. Therefore, the electron barrier layer of the active layer 75 can decrease the amount of ineffective carrier to enhance the luminous efficiency of the semiconductor light emitting device.

In the case where the semiconductor device 107 is the semiconductor laser, desirably the well layer of the active layer 75 have p=0.87 in the composition formula, namely, desirably the well layer is the $Ga_{0.87}In_{0.13}N$ compound, desirably the barrier layer have q=1 in the composition formula, namely, desirably the barrier layer is the GaN compound, and desirably the electron barrier layer have s=0.2 in the composition formula, namely, desirably the barrier layer is the $Al_{0.2}Ga_{0.8}N$ compound. Desirably the well layer has the thickness of 3 nm, desirably the barrier layer has the thickness of 10 nm, and desirably the electron barrier layer has the thickness of 20 nm. The impurity of Mg is added to the electron barrier layer in order to form the p-type semiconductor. For example, the impurity concentration ranges from $1 \times 10^{19}$ cm$^{-3}$ to $1 \times 10^{20}$ cm$^{-3}$, and preferably the impurity concentration is $5 \times 10^{19}$ cm$^{-3}$.

The n-type fifth semiconductor layer 73 is a semiconductor layer made of the $Al_xGa_yIn_{1-x-y}N$ compound. The Group-III nitride compound in which x=m ($0.01 \leq m \leq 0.15$, preferably $0.05 \leq m \leq 0.1$) and x+y=1 in the composition formula, namely, the Group-III nitride compound whose composition is expressed by $Al_mGa_{1-m}N$ (hereinafter "Group-III nitride compound thin film whose composition formula is expressed by $Al_mGa_{1-m}N$" is abbreviated to "$Al_mGa_{1-m}N$ compound") can be cited as an example of the n-type fifth semiconductor layer 73. In then-type fifth semiconductor layer 73, for example, Si which is of the n-type impurity for enhancing the carrier density is added in order to supply the electron to the active layer 75. For example, the impurity concentration ranges from $5 \times 10^{17}$ cm$^{-3}$ to $1 \times 10^{19}$ cm$^{-3}$. Preferably the thickness of the n-type fifth semiconductor layer 73 ranges from 300 nm to 2000 nm, and more preferably the thickness ranges from 400 nm to 1200 nm.

In the case where the semiconductor device 107 is the semiconductor laser, in order that then-type fifth semiconductor layer 73 functions as a cladding layer for supplying the electrons to the active layer 75, desirably the n-type fifth semiconductor layer 73 having the thickness of 1000 nm is made of the $Al_mGa_{1-m}N$ compound in which m=0.08 in the composition formula, namely, desirably the n-type fifth semiconductor layer 73 is made of the $Al_{0.08}Ga_{0.92}N$ compound, and desirably the impurity concentration of Si is $3 \times 10^{18}$ cm$^{-3}$.

The n-side sixth semiconductor layer 74 is a semiconductor layer made of the $Al_xGa_yIn_{1-x-y}N$ compound. In order not to diffuse the impurity into the active layer 75, the impurity is not added to the n-side sixth semiconductor layer 74, or the impurity having the concentration lower than that of the impurity added to the n-type fifth semiconductor layer 73 is added to the n-side sixth semiconductor layer 74. The band gap of the n-side sixth semiconductor layer 74 is designed so as to be broader than that of the active layer 75 and so as to be narrower than that of the n-type fifth semiconductor layer 73. In the case where the active layer 75 has the MQW structure, the n-side sixth semiconductor layer 74 has the band gap broader than that of the barrier layer constituting the MQW structure, and the n-side sixth semiconductor layer 74 has the band gap narrower than that of the n-type fifth semiconductor layer 73. Specifically, x=0 and y=1 are set at the composition of the n-side sixth semiconductor layer 74, namely, the n-side sixth semiconductor layer 74 is made of the GaN compound. Alternatively x=0 and $0.95 \leq y \leq 1$ may be set at the composition of the n-side sixth semiconductor layer 74, namely, the n-side sixth semiconductor layer 74 may be made of the GaInN compound. Preferably the thickness of the n-side sixth semiconductor layer 74 ranges from 20 nm to 200 (nm), and more preferably the thickness ranges from 50 nm to 150 nm.

In the case where the semiconductor device 107 is the semiconductor laser, desirably the n-side sixth semiconductor layer 74 is made of the non-doped GaN compound having the thickness of 100 nm or the low-doped GaN compound in which the concentration of the impurity Si is not more than $1\times10^{18}$ cm$^{-3}$, in order that the n-side sixth semiconductor layer 74 functions as a light guide layer which reflects and guides the light generated by the active layer 75.

The p-type eighth semiconductor layer 177 has the same configuration and effect as the first semiconductor layer 13 of the semiconductor device 101 shown in FIG. 1. In the p-type eighth semiconductor layer 177, the p-type impurity of Mg is added to form the band gap change thin film 28 in the p-type semiconductor.

In the case where the semiconductor device 107 is the semiconductor laser, in the p-type eighth semiconductor layer 177, band gap change thin films 28 which are of the cladding layer for supplying the hole to the active layer 75 are laminated such that the thickness becomes 500 nm. Desirably the impurity concentration of Mg is $3\times10^{19}$ cm$^{-3}$.

The p-side seventh semiconductor layer 76 is a semiconductor layer made of the $Al_xGa_yIn_{1-x-y}N$ compound. In order not to diffuse the impurity into the active layer 75, the impurity is not added to the p-side seventh semiconductor layer 76, or the impurity having the concentration lower than that of the impurity added to the p-type eighth semiconductor layer 177 is added to the p-side seventh semiconductor layer 76. The band gap of the p-side seventh semiconductor layer 76 is designed so as to be broader than that of the active layer 75. In the case where the active layer 75 has the MQW structure, the p-side seventh semiconductor layer 76 has the band gap broader than that of the barrier layer constituting the MQW structure, and the p-side seventh semiconductor layer 76 has the band gap narrower than that of the p-type eighth semiconductor layer 177. Specifically, x=0 and y=1 are set at the composition of the p-side seventh semiconductor layer 76, namely, the p-side seventh semiconductor layer 76 is made of the GaN compound. Alternatively x=0 and $0.95 \leq y \leq 1$ may be set at the composition of the p-side seventh semiconductor layer 76, namely, the p-side seventh semiconductor layer 76 may be made of the GaInN compound. Preferably the thickness of the p-side seventh semiconductor layer 76 ranges from 20 nm to 200 (nm), and more preferably the thickness ranges from 50 nm to 150 nm.

In the case where the semiconductor device 107 is the semiconductor laser, desirably the p-side seventh semiconductor layer 76 is made of the non-doped GaN compound having the thickness of 100 nm or the low-doped GaN compound in which the concentration of the impurity Mg is not more than $1\times10^{19}$ cm$^{-3}$, in order that the p-side seventh semiconductor layer 76 functions as the light guide layer which reflects and guides the light generated by the active layer 75.

The p-type contact layer 78 is a semiconductor layer which has the ohmic contact with the stripe-shape electrode. The GaN compound having the thickness ranging from 10 nm to 100 nm can be cited as an example of the p-type contact layer 78. In the case where the p-type contact layer 78 is made of the GaN compound, Mg can be cited as an example of the added impurity.

In the case where the semiconductor device 107 is the semiconductor laser, desirably the p-type contact layer 78 is made of the p-type GaN compound having the thickness of 50 nm in which Mg is added as the impurity.

The n-type underlying layer 72 can improve the crystallinity of the layer laminated on the n-type underlying layer 72. For example, the n-type GaN compound having the thickness ranging from 1 µm to 5 µm in which Si is added as the impurity can be cited as an example of the n-type underlying layer 72. For example, the impurity concentration ranges from $5\times10^{17}$ cm$^{-3}$ to $1\times10^{19}$ cm$^{-3}$.

The semiconductor layers of the semiconductor device 107 can sequentially be laminated on the substrate 12 by the MOCVD method described in the semiconductor device 101 of FIG. 1.

After the p-type contact layer 78 is laminated, the material of the stripe-shape electrode 79 is laminated on the p-type contact layer 78. A sputtering method and vacuum evaporation method can be used as the method of laminating the electrode material.

The stripe-shape electrode 79 is formed after the electrode material is laminated. A photolithography technique and dry etching can be used as the method of forming the stripe-shape electrode 79. A stripe-shape resist pattern is formed by the photolithography technique, and the material of the stripe-shape electrode 79 is etched in the stripe shape. At this point, an etching gas having high etching selectivity of the material of the stripe-shape electrode 79 and the p-type contact layer 78, e.g., the high etching selectivity to the GaN compound is preferably used. The p-type contact layer 78 becomes an etching stop layer, and the material of the stripe-shape electrode 79 which is not covered with the resist pattern can be etched well. The stripe-shape electrode 79 can be formed by removing the resist.

Then, in order to remove the semiconductor layers of a negative electrode portion M where the electrode 71 is formed, the resist pattern with which the upper layer of a positive electrode portion P is covered again using the photolithography technique. In the negative electrode portion M, the semiconductor layers from the p-type contact layer 78 to a part of the thickness of the n-type underlying layer 72 are removed by the dry etching. Because the etching is performed to a part of the thickness of the n-type underlying layer 72, an end point, namely, the thickness of the n-type underlying layer 72 which remains in the negative electrode portion M is controlled by an etching time.

Similarly to the formation of the stripe-shape electrode 79, the electrode 71 is formed after the negative electrode portion M is formed.

Figure 8:
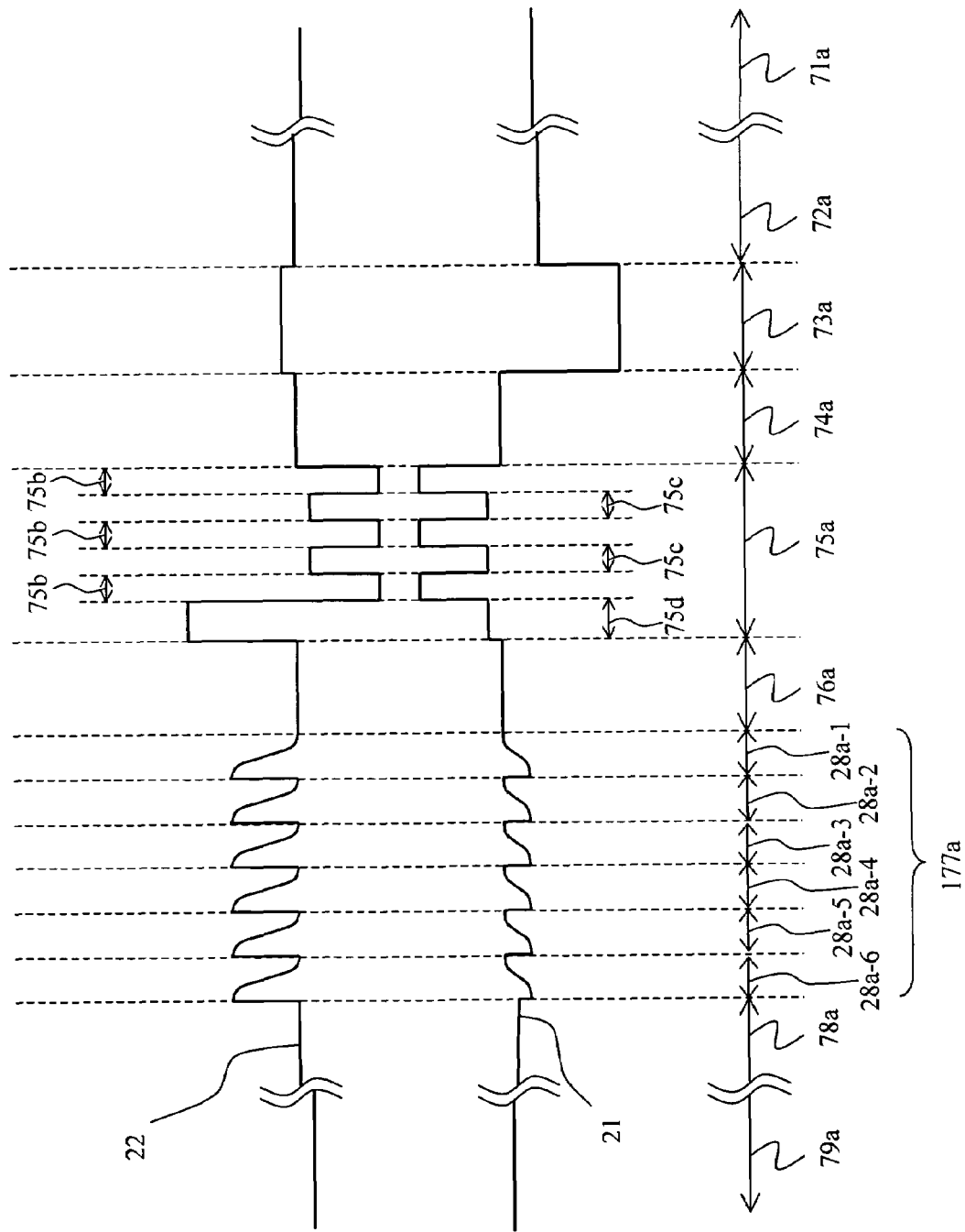
FIG. 8 schematically shows a band diagram of the semiconductor device 107 according to the fourth embodiment of the invention.

FIG. 8 schematically shows a band diagram of the semiconductor device 107. In FIG. 8, the numeral 71a designates the band gap in the region of the electrode 71, the numeral 72a designates a band gap in the region of the n-type underlying layer 72, the numeral 73a designates a band gap in the region of the n-type fifth semiconductor layer 73, the numeral 74a designates a band gap in the region of the n-side sixth semiconductor layer 74, the numeral 75a designates a band gap in the region of the active layer 75, the numeral 76a designates a band gap in the region of the p-side seventh semiconductor layer 76, the numeral 177a designates a band gap in the region of the p-type eighth semiconductor layer 177, the numeral 78a designates a band gap in the region of the p-type contact layer 78, and the numeral 79a designates a band gap in the region of the stripe-shape electrode 79. The numeral 21 designates the top level of the valence band and the numeral 22 designates the bottom level of the conduction band. In the band diagram of FIG. 8, the active layer 75 of the semiconductor device 107 has the MQW structure, and the active layer 75 has the electron barrier layer located at the end of the MQW structure on the p-type side. In the region 75a of the active layer 75, the numeral 75b designates a region of the well layer, the numeral 75c designates a region of the barrier layer, and the numeral 75d designates a region of the electron barrier layer. In FIG. 8, the bang gaps are displayed while partially neglected from the electrode 71 to the n-type underlying layer 72 and from the p-type contact layer 78 to the stripe-shape electrode 79. In FIG. 8, the same laminated film as FIG. 2 is designated by the same numeral, and the same laminated film has the same function.

The stripe-shape electrode 79 is set at the positive electrode, the electrode 71 is set at the negative electrode, and the voltage is applied. Therefore, the electrons are injected from the electrode 71 into the semiconductor device 107 and the holes are injected from the stripe-shape electrode 79 into the semiconductor device 107.

The electrons injected from the electrode 71 can smoothly be moved in the direction of the active layer 75 through the n-type underlying layer 72 and n-type fifth semiconductor layer 73 where the electron is the majority carrier. Because the band gap of the n-side sixth semiconductor layer 74 is narrower than that of the n-type fifth semiconductor layer 73, the electrons can be moved along the bottom level 22 of the conduction band to the n-side sixth semiconductor layer 74 which is stabilized from the energy standpoint. The electrons are concentrated on the well layers of the active layer 75 having the band gap narrower than that of the n-side sixth semiconductor layer 74.

On the other hand, the holes injected from the stripe-shape electrode 79 can smoothly be moved in the direction of the active layer 75 through the p-type contact layer 78 where the hole is the majority carrier. In the p-type eighth semiconductor layer 177, the holes moved from the p-type contact layer 78 can smoothly be moved in the direction of the active layer 75 as described in the semiconductor device 101 of FIG. 1. The holes moved to the p-side seventh semiconductor layer 76 are concentrated on the well layers of the active layer 75 having the band gap narrower than that of the p-side seventh semiconductor layer 76. Although the p-type electron barrier layer of the active layer 75 has the wide band gap, the p-type electron barrier layer has a few influence on the hole movement because the top level 21 of the valence band is high.

The active layer 75 emits the light having the wavelength according to the band gap expressed between the top level 21 of the valence band and the bottom level 22 of the conduction band in the quantum well by the recombination of the electrons and holes which are concentrated on the well layers.

Because the semiconductor layer 107 includes the p-type eighth semiconductor layer 177, the holes can smoothly be moved from the p-type contact layer 78 to the p-side seventh semiconductor layer 76, even if the thickness of the p-type eighth semiconductor layer 177 is increased.

Thus, according to the invention, the activation of the impurity is promoted to enhance the carrier density without increasing the impurity concentration, i.e., without decreasing the reliability, and thereby the semiconductor device having high reliability and the low electric resistance can be provided.

Fifth Embodiment

Figure 9:
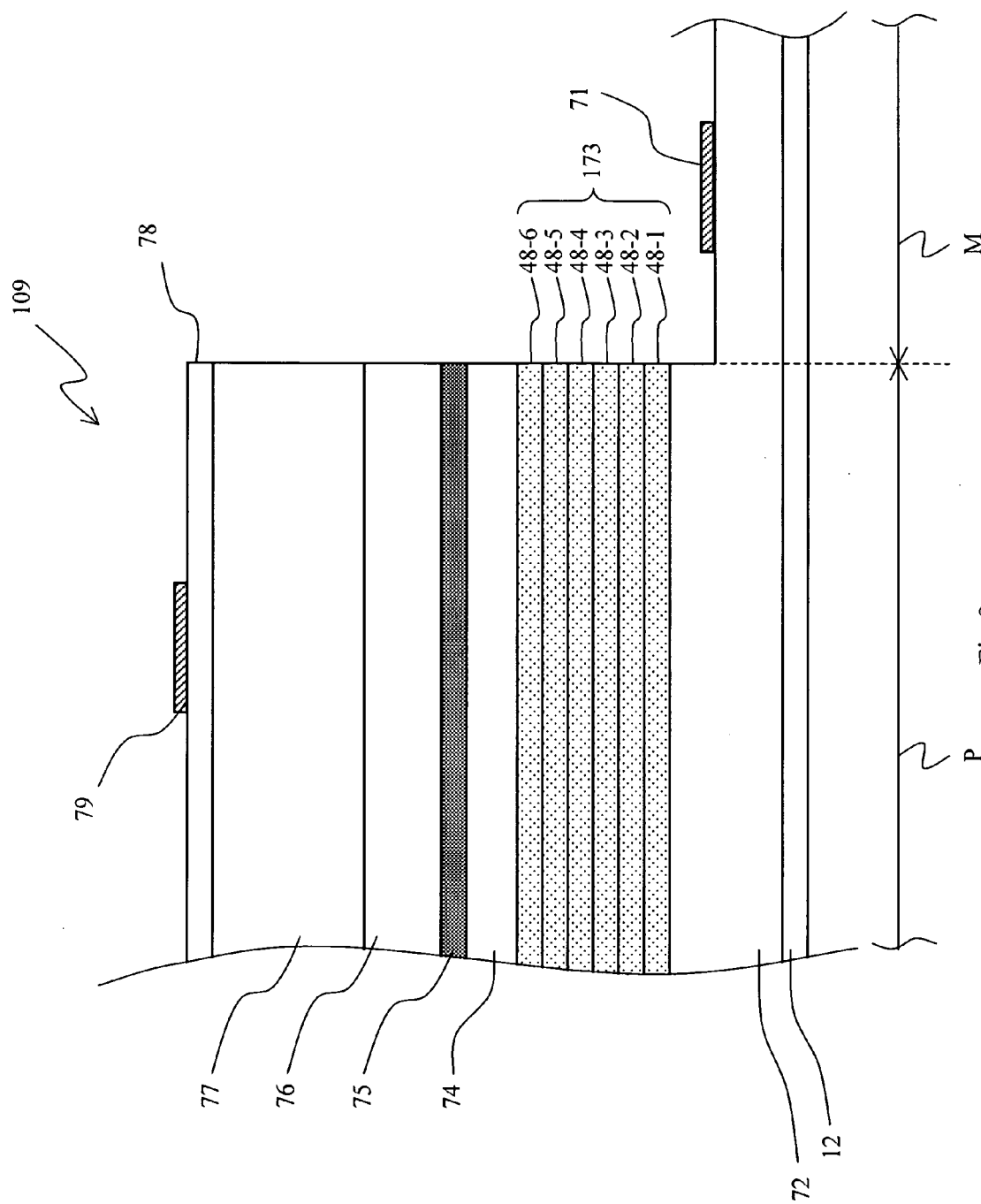
FIG. 9 is a sectional view schematically showing a semiconductor device 109 according to a fifth embodiment of the invention.

FIG. 9 is a sectional view schematically showing a semiconductor device 109 according to a fifth embodiment of the invention. The semiconductor device 109 includes the electrode 71, the n-type underlying layer 72, an n-type fifth semiconductor layer 173, the n-side sixth semiconductor layer 74, the active layer 75 the p-side seventh semiconductor layer 76, a p-type eighth semiconductor layer 77, the p-type contact layer 78, and the stripe-shape electrode 79. Similarly to the semiconductor device 107, the semiconductor device 109 is a semiconductor light emitting device in which the electrode 71 and the stripe-shape electrode 79 are arranged on the same side with respect to the substrate 12. The semiconductor device 109 differs from the semiconductor device 107 as follows. That is, the semiconductor device 109 includes the p-type eighth semiconductor layer 77 instead of the p-type eighth semiconductor layer 177 of the semiconductor device 107, and the semiconductor device 109 includes the n-type fifth semiconductor layer 173 instead of the n-type fifth semiconductor layer 73 of the semiconductor device 107. In FIG. 9, the same layer or thin film as FIGS. 1 and 7 is designated by the same numeral, and the same layer or thin film has the same function.

The p-type eighth semiconductor layer 77 is a semiconductor layer made of the $Al_xGa_yIn_{1-x-y}N$ compound. The Group-III nitride compound in which x=m ($0.01 \leq m \leq 0.15$, preferably $0.05 \leq m \leq 0.1$) and x+y=1 in the composition formula, namely, the $Al_mGa_{1-m}N$ compound can be cited as an example of the p-type eighth semiconductor layer 77. In the p-type eighth semiconductor layer 77, for example, Mg which is of the p-type impurity is added in order to enhance the carrier density. For example, the impurity concentration ranges from $5 \times 10^{18}$ cm$^{-3}$ to $1 \times 10^{20}$ cm$^{-3}$. Preferably the thickness of the p-type eighth semiconductor layer 77 ranges from 100 nm to 2000 nm, and more preferably the thickness ranges from 200 nm to 500 nm.

In the case where the semiconductor device 109 is the semiconductor laser, in order that the p-type eighth semiconductor layer 77 functions as the cladding layer for supplying the holes to the active layer 75, desirably the p-type eighth semiconductor layer 77 having the thickness of 500 nm is made of the $Al_mGa_{1-m}N$ compound in which m=0.08 in the composition formula, namely, desirably the p-type eighth semiconductor layer 77 is made of the $Al_{0.08}Ga_{0.92}N$ compound, and desirably the impurity concentration of Mg is $3 \times 10^{19}$ cm$^{-3}$.

Similarly to the third semiconductor layer 53 described in the semiconductor device 105 of FIG. 5, the n-type fifth semiconductor layer 173 is formed by laminating the band gap change thin films 48, and the n-type fifth semiconductor layer 173 has the same configuration and effect as the third semiconductor layer 53. In then-type fifth semiconductor layer 173, the n-type impurity of Si is added in order to form the band gap change thin film 48 into the n-type semiconductor.

In the case where the semiconductor device 109 is the semiconductor laser, in order that the n-type fifth semiconductor layer 173 functions as the cladding layer for supplying the electrons to the active layer 75, desirably the n-type fifth semiconductor layer 173 is formed by laminating the band gap change thin films 48 such that the thickness becomes 1000 nm. Desirably the impurity concentration of Mg is $3 \times 10^{18}$ cm$^{-3}$.

The semiconductor device 109 is produced in the same manner as the semiconductor device 107 of FIG. 7.

Figure 10:
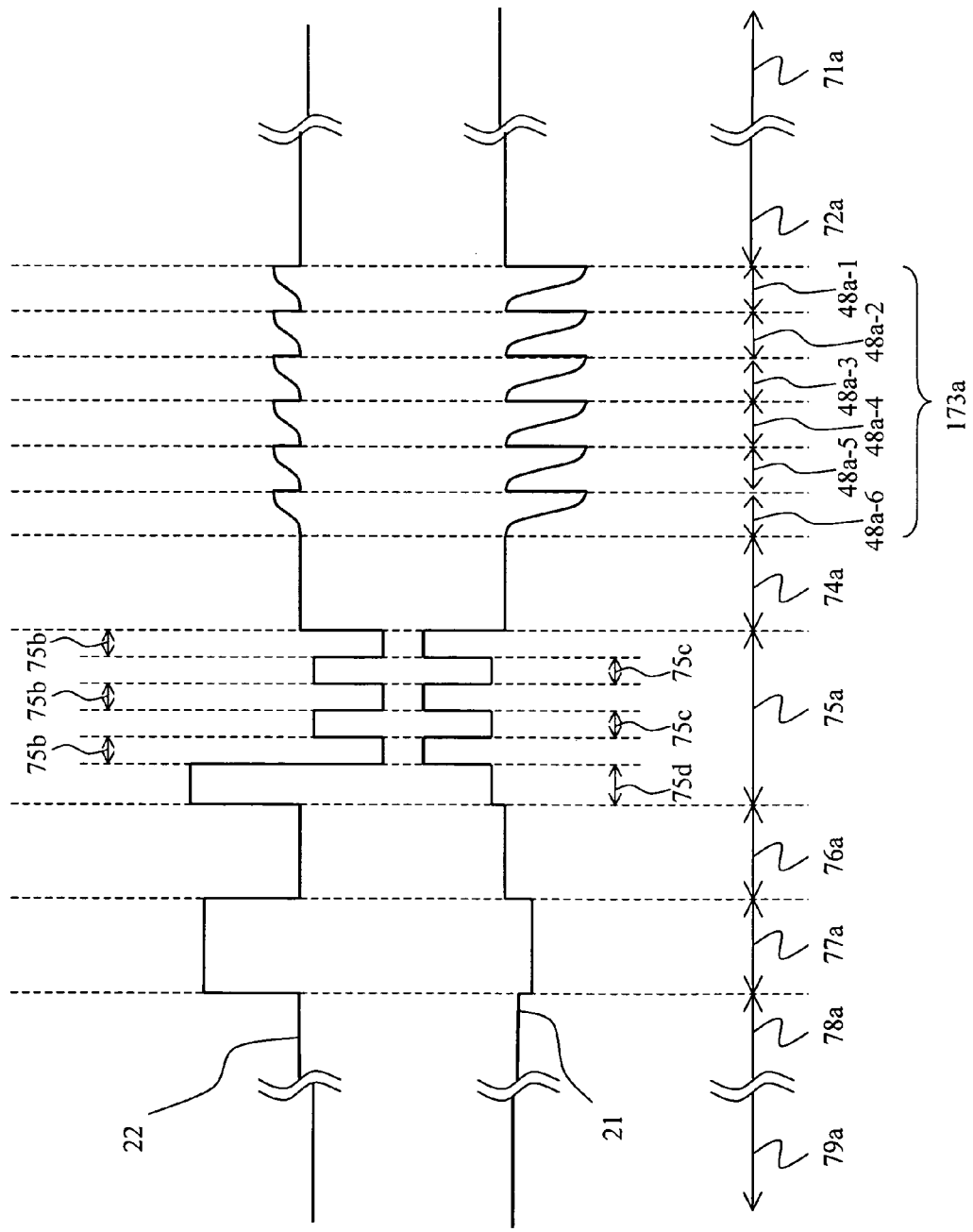
FIG. 10 schematically shows a band diagram of the semiconductor device 109 according to the fifth embodiment of the invention.

FIG. 10 schematically shows a band diagram of the semiconductor device 109. In FIG. 10, the same laminated film as FIGS. 2 and 8 is designated by the same numeral, and the same laminated film has the same function.

The band diagram of the semiconductor device 109 of FIG. 10 differs from the band diagram of the semiconductor device 107 of FIG. 8 as follows. That is, a region 77a of the p-type eighth semiconductor layer 77 exists in the band diagram of the semiconductor device 109 of FIG. 10 instead of the region 177a of the p-type eighth semiconductor layer 177 in the band diagram of the semiconductor device 107 of FIG. 8, and a region 173a of the n-type fifth semiconductor layer 173 instead of the region 73a of the n-type fifth semiconductor layer 73 in the band diagram of the semiconductor device 107.

The electrons injected from the electrode 71 can smoothly be moved in the direction of the active layer 75 through the n-type underlying layer 72 where the electron is the majority carrier. In the n-type fifth semiconductor layer 173, the electrons moved from the n-type underlying layer 72 can smoothly be moved in the direction of the active layer 75 as described in the semiconductor device 103 of FIG. 3. The electrons moved to the n-side sixth semiconductor layer 74 are concentrated on the well layers of the active layer 75 having the band gap narrower than that of the n-side sixth semiconductor layer 74.

On the other hand, the holes injected from the stripe-shape electrode 79 can smoothly be moved in the direction of the active layer 75 through the p-type contact layer 78 and p-type eighth semiconductor layer 77 where the hole is the majority carrier. Because the band gap of the p-side seventh semiconductor layer 76 is narrower than that of the p-type eighth semiconductor layer 77, the holes can be moved along the bottom level 22 of the conduction band to the p-side seventh semiconductor layer 76 which is stabilized in the energy standpoint. The holes are concentrated on the well layers of the active layer 75 having the band gap narrower than that of the p-side seventh semiconductor layer 76.

The active layer 75 emits the light having the wavelength according to the band gap expressed between the top level 21 of the valence band and the bottom level 22 of the conduction band in the quantum well by the recombination of the electrons and holes which are concentrated on the well layers.

Because the semiconductor layer 109 includes the n-type fifth semiconductor layer 173, the electrons can smoothly be moved from the n-type underlying layer 72 to the n-side sixth semiconductor layer 74, even if the thickness of the n-type fifth semiconductor layer 173 is increased.

Thus, according to the invention, the activation of the impurity is promoted to enhance the carrier density without increasing the impurity concentration, i.e., without decreasing the reliability, and thereby the semiconductor device having high reliability and the low electric resistance can be provided.

Sixth Embodiment

Figure 11:
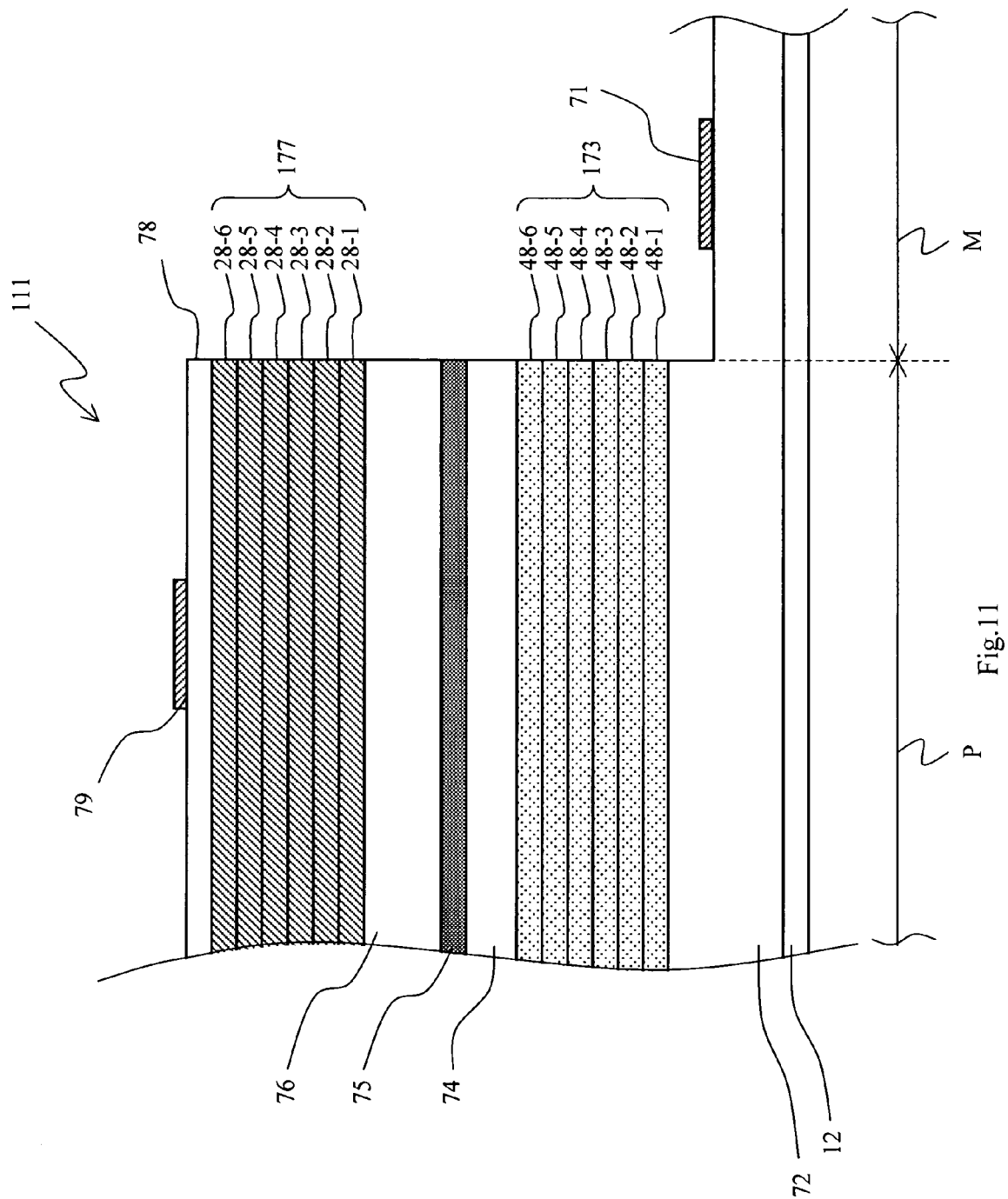
FIG. 11 is a sectional view schematically showing a semiconductor device 111 according to a sixth embodiment of the invention.

FIG. 11 is a sectional view schematically showing a semiconductor device 111 according to a sixth embodiment of the invention. The semiconductor device 111 includes the electrode 71, the n-type underlying layer 72, the n-type fifth semiconductor layer 173, the n-side sixth semiconductor layer 74, the active layer 75, the p-side seventh semiconductor layer 76, a p-side eighth semiconductor layer 177, the p-type contact layer 78, and the stripe-shape electrode 79. Similarly to the semiconductor device 107, the semiconductor device 111 is a semiconductor light emitting device in which the electrode 71 and the stripe-shape electrode 79 are arranged on the same side with respect to the substrate 12. The semiconductor device 111 differs from the semiconductor device 107 in that the semiconductor device 111 includes the n-type fifth semiconductor layer 173 instead of the n-type fifth semiconductor layer 73 of the semiconductor device 107. In FIG. 11, the same layer or thin film as FIGS. 1, 3, 7, and 9 is designated by the same numeral, and the same layer or thin film has the same function.

The semiconductor device 111 is produced in the same manner as the semiconductor device 107 of FIG. 7.

Figure 12:
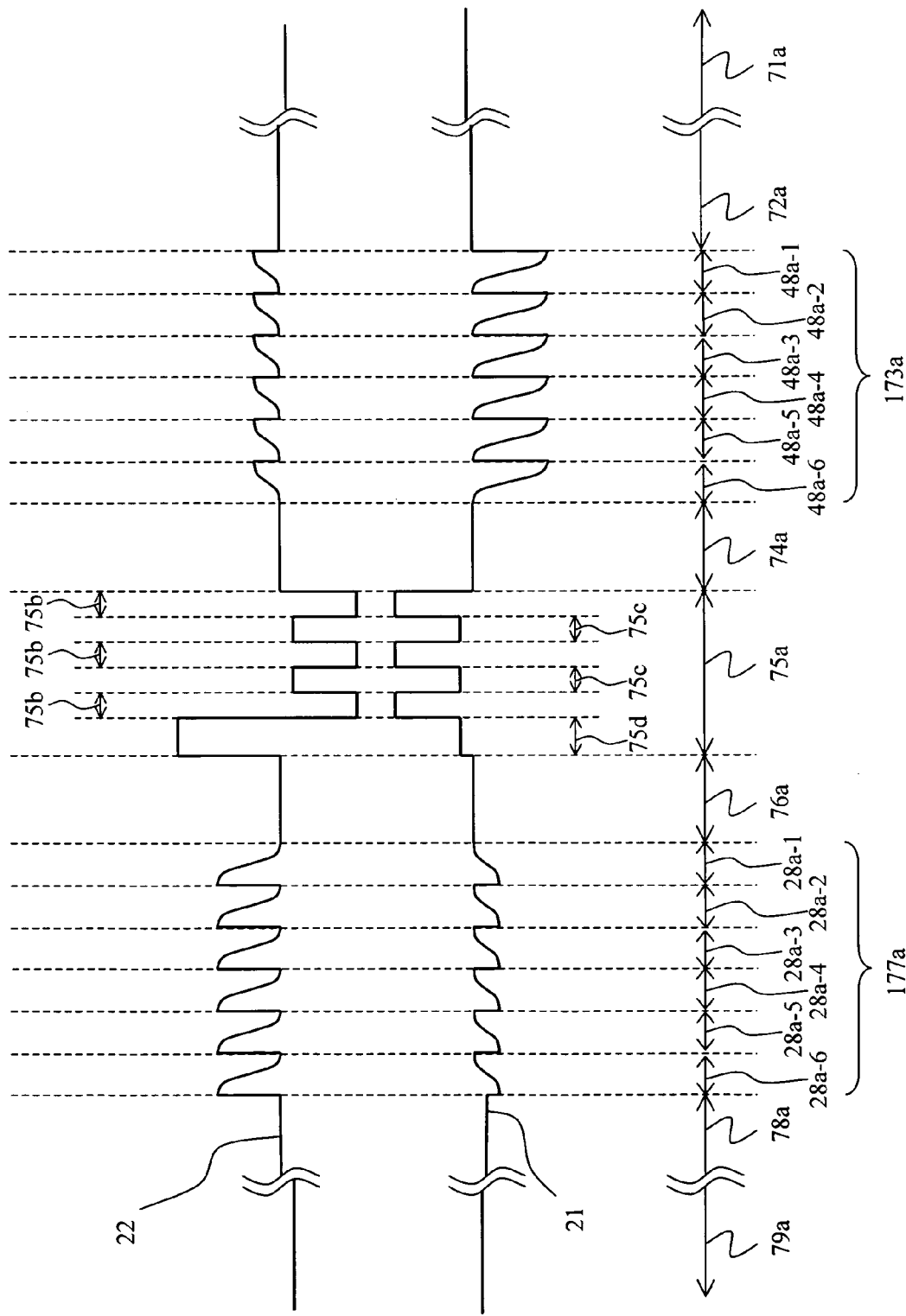
FIG. 12 schematically shows a band diagram of the semiconductor device 111 according to the sixth embodiment of the invention.
Figure 13:
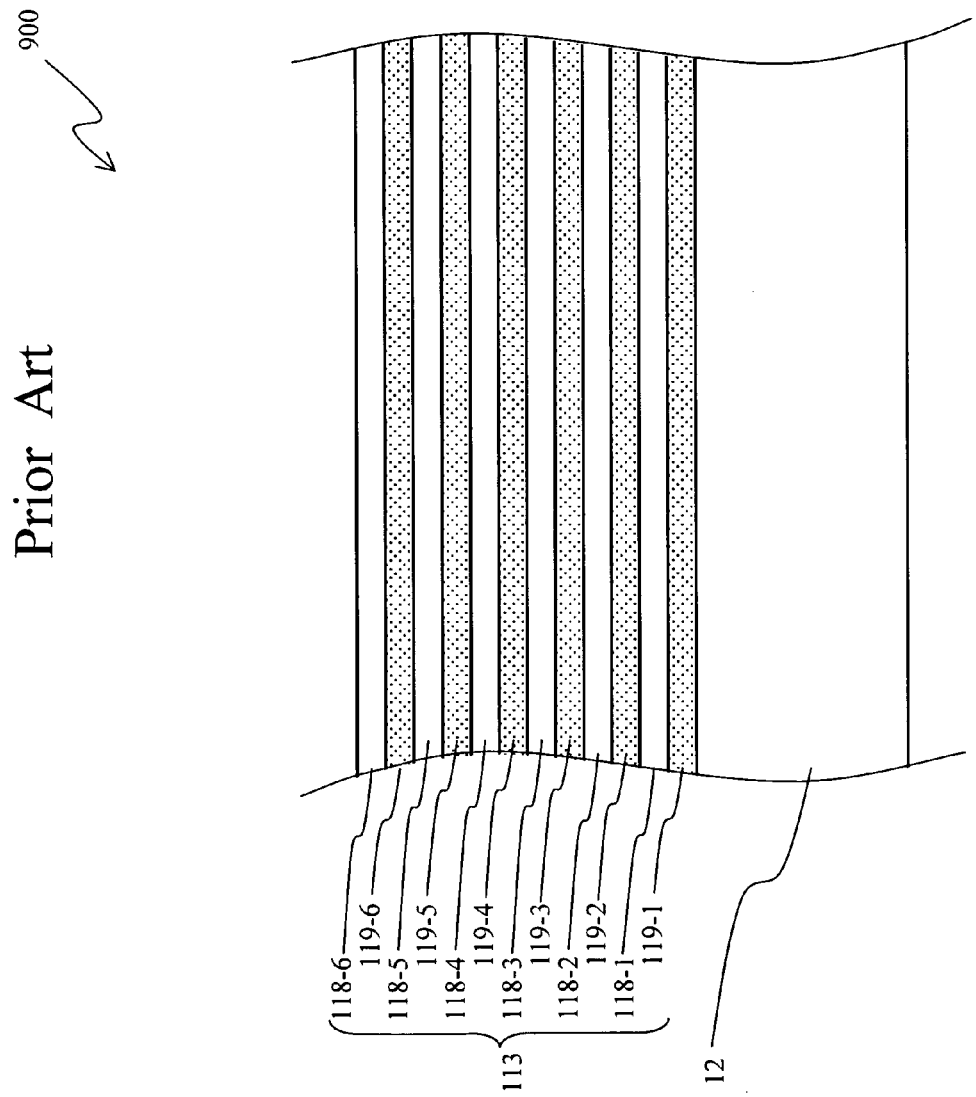
FIG. 13 is a sectional view schematically showing a conventional semiconductor device 900.

FIG. 12 schematically shows a band diagram of the semiconductor device 111. In FIG. 12, the same region of the laminated film as FIGS. 2, 4, 8, and 10 is designated by the same numeral, and the same region of the laminated film has the same function.

The band diagram of the semiconductor device 111 of FIG. 12 differs from the band diagram of the semiconductor device 107 of FIG. 8 in that the region 173a of the n-type fifth semiconductor layer 173 exists in the band diagram of the semiconductor device 111 of FIG. 12 instead of the region 73a of the n-type fifth semiconductor layer 73 in the band diagram of the semiconductor device 109 of FIG. 8.

The electrons injected from the electrode 71 are concentrated on the well layers of the active layer 75 as described in the band diagram of the semiconductor device 111 of FIG. 12.

On the other hand, the holes injected from the stripe-shape electrode 79 are concentrated on the well layers of the active layer 75 as described in the band diagram of the semiconductor device 107 of FIG. 8.

The active layer 75 emits the light having the wavelength according to the band gap expressed between the top level 21 of the valence band and the bottom level 22 of the conduction band in the quantum well by the recombination of the electrons and holes which are concentrated on the well layers.

Because the semiconductor layer 111 includes the n-type fifth semiconductor layer 173, the electrons can smoothly be moved from the n-type underlying layer 72 to the n-side sixth semiconductor layer 74, even if the thickness of the n-type fifth semiconductor layer 173 is increased. Further, because the semiconductor layer 111 includes the p-type eighth semiconductor layer 177, the holes can smoothly be moved from the p-type contact layer 78 to the p-side seventh semiconductor layer 76, even if the thickness of the p-type eighth semiconductor layer 177 is increased.

Thus, according to the invention, the activation of the impurity is promoted to enhance the carrier density without increasing the impurity concentration, i.e., without decreasing the reliability, and thereby the semiconductor device having high reliability and the low electric resistance can be provided.

The semiconductor device of the invention can be applied to the light acceptance device. The semiconductor device of the invention can also be applied to electronic devices such as a transistor and a diode and compound semiconductor high-frequency electronic devices typified by HEMT.

What is claimed is:

1. A semiconductor device comprising a semiconductor layer in which a plurality of band gap change thin films are continuously laminated, a band gap being continuously monotonously changed in a laminating direction in the band gap change thin film,
   wherein directions in which the band gaps of at least the two adjacent band gap change thin films are monotonously changed and the band gap directions of the at least the two adjacent band gap change thin films are equal to each other in the semiconductor layer, and the semiconductor layer has a hetero-interface between the two adjacent band gap change thin films.

2. The semiconductor device according to claim 1,
   wherein the band gap change thin film is formed by a nitride semiconductor, the nitride semiconductor being made of a Group- 111 nitride compound expressed by a composition formula $Al_xGa_yIn_{1-x-y}N$ ($0 \leq x \leq 1$, $0 \leq y \leq 1$, $0 \leq x+y \leq 1$).

3. The semiconductor device according to claim 2,
   wherein the band gap change thin film contains as an n-type impurity.

4. The semiconductor device according to claim 2,
   wherein the band gap change thin film contains Mg as a p-type impurity.

* * * * *